United States Patent
Baek et al.

(10) Patent No.: US 10,347,598 B2
(45) Date of Patent: Jul. 9, 2019

(54) COMPOSITE ANTENNA SUBSTRATE AND SEMICONDUCTOR PACKAGE MODULE

(71) Applicant: SAMSUNG ELECTRO-MECHANICS CO., LTD., Suwon-Si, Gyeonggi-Do (KR)

(72) Inventors: Yong Ho Baek, Suwon-Si (KR); Doo Il Kim, Suwon-Si (KR); Young Sik Hur, Suwon-Si (KR); Jung Hyun Cho, Suwon-Si (KR); Won Wook So, Suwon-Si (KR)

(73) Assignee: Samsung Electro-Mechanics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/941,334

(22) Filed: Mar. 30, 2018

(65) Prior Publication Data
US 2018/0337148 A1    Nov. 22, 2018

(30) Foreign Application Priority Data

May 19, 2017  (KR) .................. 10-2017-0062550
Sep. 15, 2017 (KR) .................. 10-2017-0118704

(51) Int. Cl.
*H01L 23/00* (2006.01)
*H01L 23/31* (2006.01)
*H01L 23/66* (2006.01)
*H01L 25/065* (2006.01)

(52) U.S. Cl.
CPC .......... *H01L 23/66* (2013.01); *H01L 23/3121* (2013.01); *H01L 24/13* (2013.01); *H01L 24/16* (2013.01); *H01L 25/0657* (2013.01); *H01L 23/3128* (2013.01); *H01L 2223/6677* (2013.01); *H01L 2224/0401* (2013.01); *H01L 2924/1421* (2013.01)

(58) Field of Classification Search
CPC combination set(s) only.
See application file for complete search history.

(56) References Cited

U.S. PATENT DOCUMENTS

| 9,331,030 B1 | 5/2016 | Tsai et al. | |
| 2013/0009320 A1* | 1/2013 | Yoo | ................ H01L 23/49827 257/774 |
| 2015/0016078 A1 | 1/2015 | Yang et al. | |
| 2015/0061091 A1 | 3/2015 | Seller et al. | |

(Continued)

OTHER PUBLICATIONS

U.S. Office Action dated Feb. 25, 2019 issued in U.S. Appl. No. 16/218,203.

(Continued)

*Primary Examiner* — Jasmine J Clark
(74) *Attorney, Agent, or Firm* — Morgan, Lewis & Bockius LLP

(57) ABSTRACT

A composite antenna substrate and semiconductor package module includes: a fan-out semiconductor package including a semiconductor chip, an encapsulant encapsulating at least portions of the semiconductor chip, and a connection member including a redistribution layer electrically connected to connection pads; and an antenna substrate including an antenna member including antenna patterns, ground patterns, and feed lines, and a wiring member disposed below the antenna member and including wiring layers including feeding patterns electrically connected to the feed lines.

25 Claims, 21 Drawing Sheets

(56) References Cited

U.S. PATENT DOCUMENTS

| 2016/0240492 | A1 | 8/2016 | Wolter et al. |
| 2017/0033062 | A1 | 2/2017 | Liu et al. |
| 2017/0040266 | A1 | 2/2017 | Lin et al. |
| 2018/0166405 | A1* | 6/2018 | Chiang .................. H01L 23/66 |

OTHER PUBLICATIONS

Taiwanese Office Action dated Feb. 18, 2019 issued in Taiwanese Patent Application No. 107112102 (with English translation).

* cited by examiner

COMPOSITE ANTENNA SUBSTRATE AND SEMICONDUCTOR PACKAGE MODULE

CROSS-REFERENCE TO RELATED APPLICATION(S)

This application claims benefit of priority to Korean Patent Application Nos. 10-2017-0062550 filed on May 19, 2017 and 10-2017-0118704 filed on Sep. 15, 2017 in the Korean Intellectual Property Office, the disclosures of which are incorporated herein by references in their entirety.

TECHNICAL FIELD

The present disclosure relates to a composite antenna substrate and semiconductor package module.

BACKGROUND

Applications that use millimeter waves of 10 GHz or more have been widely used for motion sensor products that detect motion to increase user interface (I/F) convenience, action monitoring sensor products for security that confirm an intruder in a predetermined space, 24 GHz and 77 GHz radar systems for near-field and far-field detection for an automobile, and the like, as well as fifth generation (5G) communications for mobile or 60 GHz communications. In the case of a product using the millimeter waves as described above, when a signal is transferred from a radio frequency integrated circuit (RFIC) to an antenna or from the antenna to the RFIC, the signal should be transferred so that loss of the signal is minimized. Conventionally, to this end, the RFIC and the antenna are connected to each other by a coaxial cable to minimize signal attenuation, which is inefficient in terms of space and cost.

In recent 60 GHz communications systems, designing a 60 GHz antenna using a material such as a low temperature co-fired ceramic (LTCC), or the like, and then attaching the 60 GHz antenna to the RFIC to significantly reduce a distance between components is being used. In addition, in some radar systems for automobiles, the RFIC is mounted on a main printed circuit board (PCB). The antenna patterns are formed on and connected to the main PCB or mounted as a separate antenna module on the main PCB. However, in this manner, it is difficult to sufficiently prevent the generation of line-to-line loss between components.

Recently, in accordance with the development of package technology, a method of forming an antenna in an RFIC package has been developed, and a manner of forming antenna patterns on redistribution layers (RDL) of the RFIC package has been used in some cases. However, in this manner, there are several design limitations in terms of securing radiation performance of the antenna or there is the possibility that a performance error will occur. Therefore, stable RFIC and antenna integration package design technology capable of having a degree of design flexibility and significantly reducing a design error is required.

SUMMARY

An aspect of the present disclosure may provide a composite antenna substrate and semiconductor package module in which a signal path between an antenna and a semiconductor chip may be designed to have a shortest distance, omnidirectional coverage characteristics may be secured, and reception sensitivity of the antenna may be improved.

According to an aspect of the present disclosure, a semiconductor package including a semiconductor chip and an antenna substrate including an antenna may be compositely modularized.

According to an aspect of the present disclosure, a composite antenna substrate and semiconductor package module may include: a fan-out semiconductor package including a semiconductor chip having an active surface having connection pads disposed thereon and an inactive surface opposing the active surface, an encapsulant encapsulating at least portions of the semiconductor chip, and a connection member disposed on the semiconductor chip and including a redistribution layer electrically connected to the connection pads; and an antenna substrate including an antenna member and a wiring member disposed below the antenna member, the antenna member including an insulating layer, a first pattern layer disposed on an upper surface of the insulating layer and including antenna patterns, a second pattern layer disposed on a lower surface of the insulating layer and including ground patterns, and vias penetrating through the insulating layer and including feed lines electrically connected to the antenna patterns, and the wiring member including wiring layers including feeding patterns electrically connected to the feed lines, wherein the fan-out semiconductor package and the antenna substrate are coupled to each other so that the connection member and the wiring member face each other.

According to another aspect of the present disclosure, a composite antenna substrate and semiconductor package module may include: a fan-out semiconductor package including a core member having a through-hole, a semiconductor chip disposed in the through-hole and having an active surface having connection pads disposed thereon and an inactive surface opposing the active surface, an encapsulant encapsulating at least portions of the semiconductor chip, and a connection member disposed on the semiconductor chip, the core member and the connection member including, respectively, a core wiring layer and a redistribution layer electrically connected to the connection pads; and an antenna substrate including an antenna member in which a first pattern layer including antenna patterns is disposed on an insulating layer, a second pattern layer including ground patterns is disposed below the insulating layer, and vias penetrating through the insulating layer and including feed lines electrically connected to the antenna patterns are formed in the insulating layer, and a wiring member disposed below the antenna member and including wiring layers including feeding patterns electrically connected to the feed lines, wherein the antenna substrate is stacked on the fan-out semiconductor package, and the antenna substrate and the fan-out semiconductor package are connected to each other through electrical connection structures.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Figure 1:
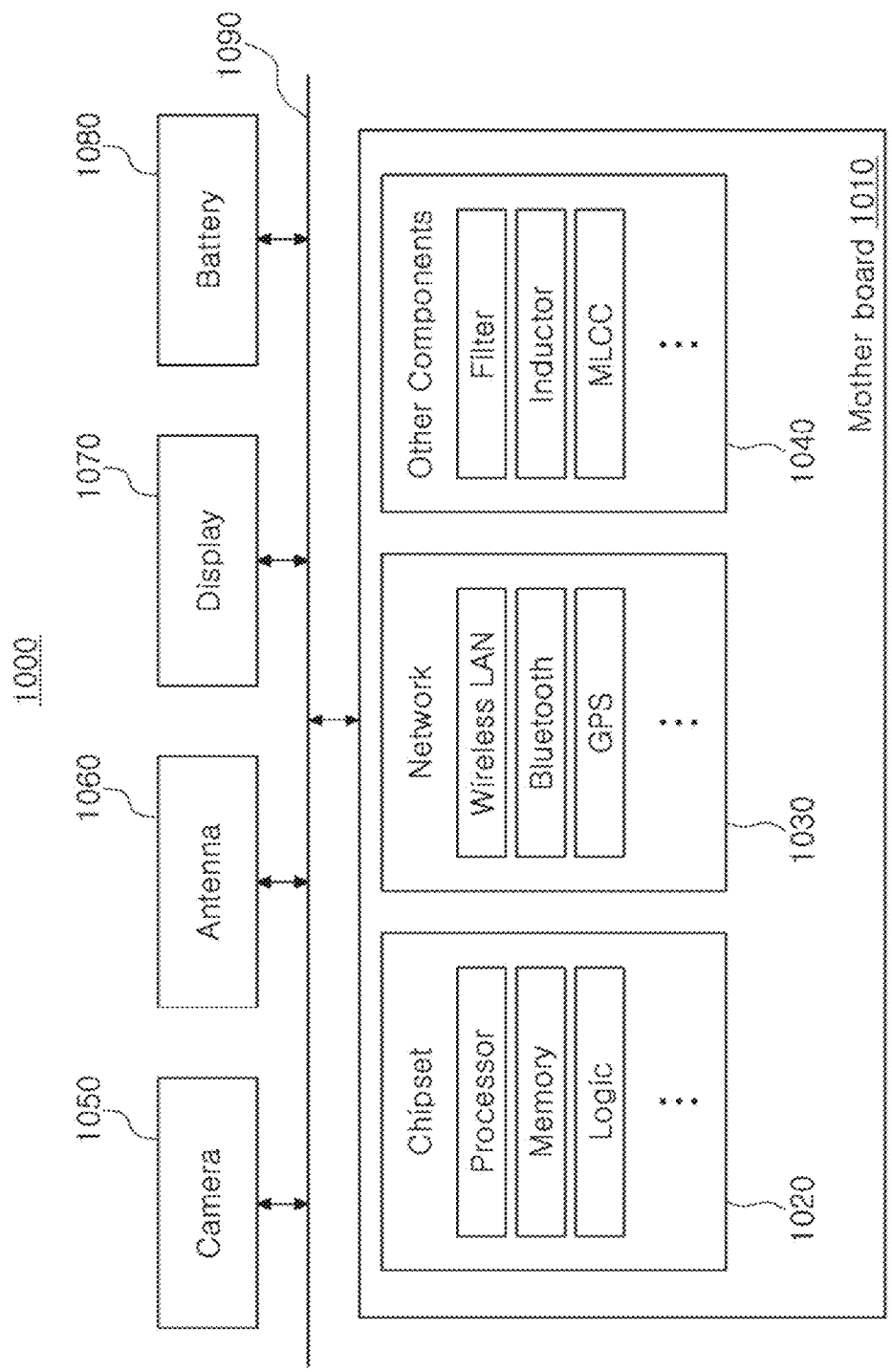
FIG. 1 is a schematic block diagram illustrating an example of an electronic device system.

Hereinafter, exemplary embodiments in the present disclosure will be described with reference to the accompanying drawings. In the accompanying drawings, shapes, sizes, and the like, of components may be exaggerated or shortened for clarity.

The expression "coupling" conceptually includes a case in which two components are integrated with each other to be in contact with each other and a form in which two components are stacked using an intermediary.

The term "an exemplary embodiment" used herein does not refer to the same exemplary embodiment, and is provided to emphasize a particular feature or characteristic, different from that of another exemplary embodiment. However, exemplary embodiments provided herein are considered to be able to be implemented by being combined with one another in whole or in part. For example, one element described in a particular exemplary embodiment, even if it is not described in another exemplary embodiment, may be understood as a description related to another exemplary embodiment, unless an opposite or contradictory description is provided therein.

The meaning of a "connection" of a component to another component in the description includes an indirect connection through a third component as well as a direct connection between two components. In addition, "electrically connected," conceptually includes a physical connection and a physical disconnection. For example, "electrically connected" includes a signal connection in spite of the physical disconnection. It can be understood that when an element is referred to with "first" and "second", the element is not limited thereby. Such terms may be used only for the purpose of distinguishing the element from other elements, and may not limit the sequence or importance of the elements. In some cases, a first element may be referred to as a second element without departing from the scope of the claims set forth herein. Similarly, a second element may also be referred to as a first element.

Herein, an upper portion, a lower portion, an upper side, a lower side, an upper surface, a lower surface, and the like, are taken on the basis of the attached drawings. For example, a first connection member is disposed on a level above a redistribution layer. However, the claims are not limited thereto. In addition, a vertical direction refers to the abovementioned upward and downward directions, and a horizontal direction refers to a direction perpendicular to the abovementioned upward and downward directions. In this case, a vertical cross section refers to a case taken along a plane in the vertical direction, and an example thereof may be a cross-sectional view illustrated in the drawings. In addition, a horizontal cross section refers to a case taken along a plane in the horizontal direction, and an example thereof may be a plan view illustrated in the drawings.

Electronic Device

FIG. 1 is a schematic block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as, for example, a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, but may also include other types of chip related components. In addition, the chip related components 1020 may be combined with each other.

The network related components 1030 may include protocols such as, for example, wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), highspeed uplink packet access+(HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols designated after the abovementioned protocols. However, the network related components 1030 are not limited thereto, but may also include a variety of other wireless or wired standards or protocols. In addition, the network related components 1030 may be combined with each other, together with the chip related components 1020 described above.

Other components 1040 may include, without limitation, a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the mainboard 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be, for example, a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
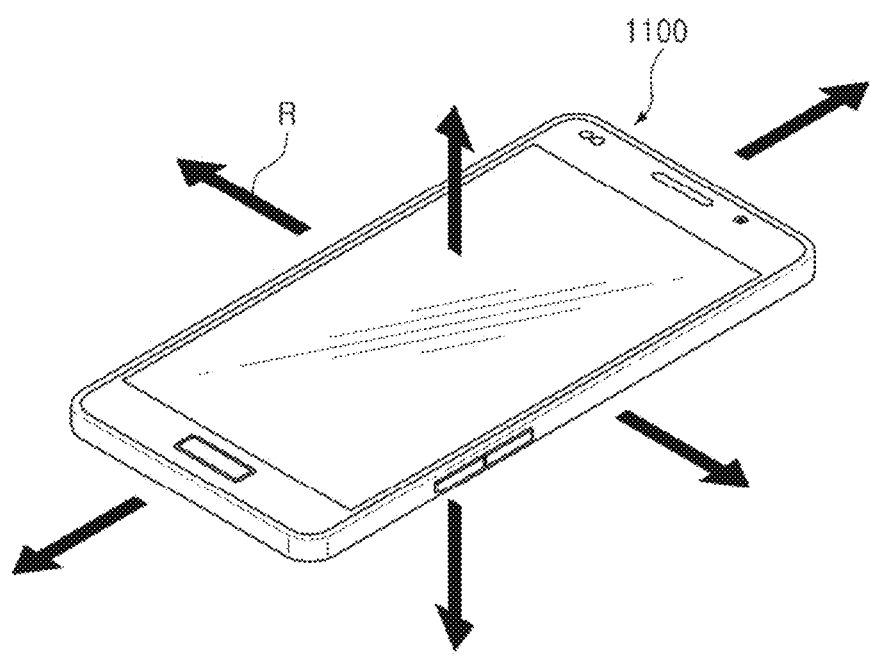
FIG. 2 is a schematic perspective view illustrating an example of an electronic device.

FIG. 2 is a schematic perspective view illustrating an example of an electronic device.

Referring to FIG. 2, an electronic device may be, for example, a smartphone 1100. In the smartphone 1100, a radio frequency integrated circuit (RFIC) may be used in a semiconductor package form, and an antenna may be used in a substrate or module form. The RFIC and the antenna may be electrically connected to each other in the smartphone 1100, and radiation R of antenna signals in various directions may be thus possible. A semiconductor package including the RFIC and a substrate or a module including the antenna may be used in various forms in an electronic device such as the smartphone, or the like.

Semiconductor Package

Generally, numerous fine electrical circuits are integrated in a semiconductor chip. However, the semiconductor chip may not serve as a finished semiconductor product in itself, and may be damaged due to external physical or chemical impacts. Therefore, the semiconductor chip itself may not be used, but may be packaged and used in an electronic device, or the like, in a packaged state.

Here, semiconductor packaging is required due to the existence of a difference in a circuit width between the semiconductor chip and a mainboard of the electronic device in terms of electrical connections. In detail, a size of connection pads of the semiconductor chip and an interval between the connection pads of the semiconductor chip are very fine, but a size of component mounting pads of the mainboard used in the electronic device and an interval between the component mounting pads of the mainboard are significantly larger than those of the semiconductor chip. Therefore, it may be difficult to directly mount the semiconductor chip on the mainboard, and packaging technology for buffering a difference in a circuit width between the semiconductor chip and the mainboard may be desirable.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-In Semiconductor Package

FIGS. 3A and 3B are schematic cross-sectional views illustrating states of a fan-in semiconductor package before and after being packaged.

Figure 4:
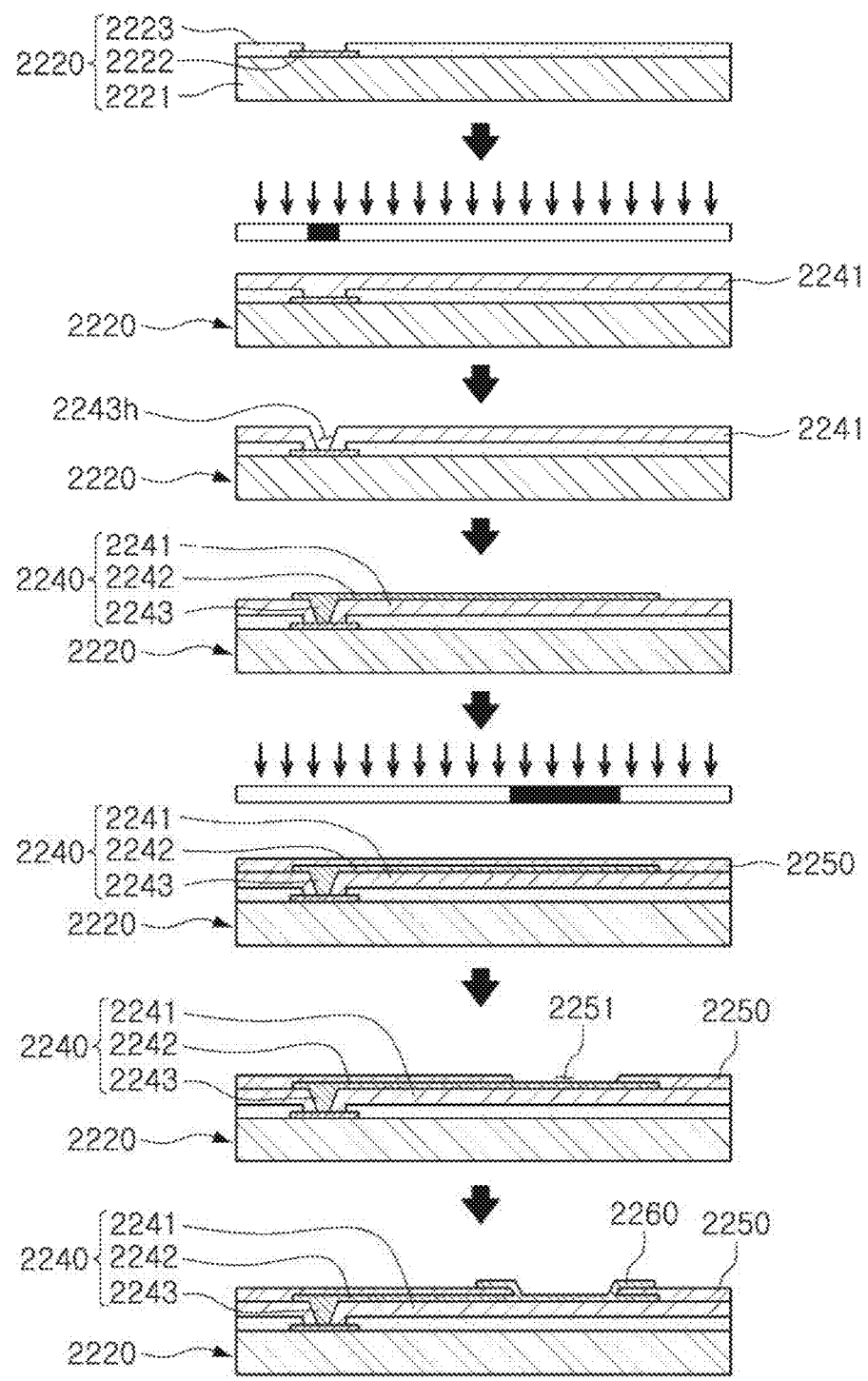
FIG. 4 is schematic cross-sectional views illustrating a packaging process of a fan-in semiconductor package.

FIG. 4 is schematic cross-sectional views illustrating a packaging process of a fan-in semiconductor package.

Figure 3:
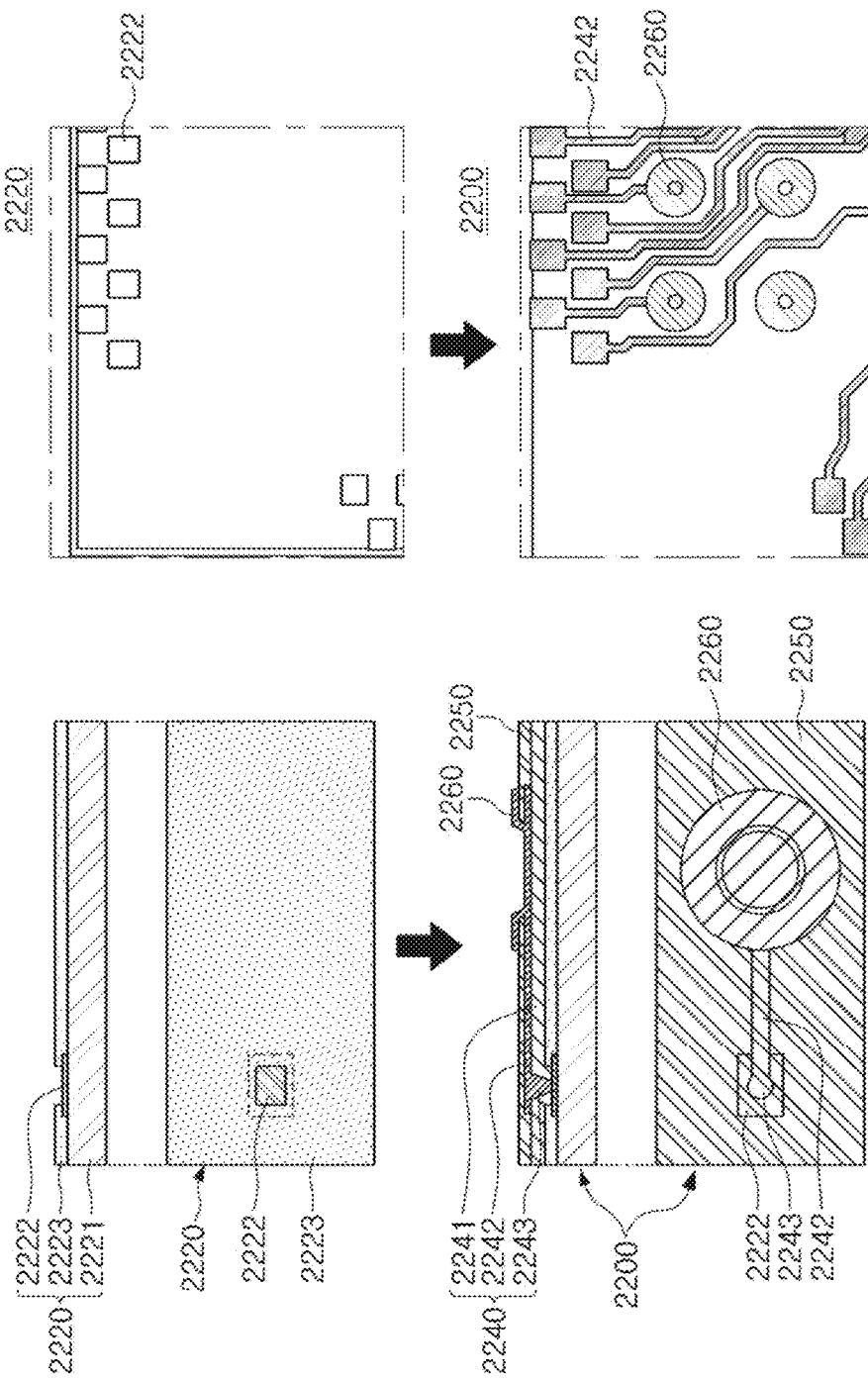
FIGS. 3A and 3B are schematic cross-sectional views illustrating states of a fan-in semiconductor package before and after being packaged.

Referring to FIGS. 3 and 4, a semiconductor chip 2220 may be, for example, an integrated circuit (IC) in a bare state, including a body 2221 including, without limitation, silicon (Si), germanium (Ge), gallium arsenide (GaAs), or the like, connection pads 2222 formed on one surface of the body 2221 and including a conductive material such as, for example, aluminum (Al), or the like, and a passivation layer 2223 such as an oxide film, a nitride film, or the like, formed on one surface of the body 2221 and covering at least portions of the connection pads 2222. In this case, since the connection pads 2222 are significantly small, it is difficult to mount the integrated circuit (IC) on an intermediate level printed circuit board (PCB) as well as on the mainboard of the electronic device, or the like.

Therefore, a connection member 2240 may be formed depending on a size of the semiconductor chip 2220 on the semiconductor chip 2220 in order to redistribute the connection pads 2222. The connection member 2240 may be formed by forming an insulating layer 2241 on the semiconductor chip 2220 using an insulating material such as, for example, photoimagable dielectric (PID) resin, forming via holes 2243*h* opening the connection pads 2222, and then forming wiring patterns 2242 and vias 2243. Then, a passivation layer 2250 protecting the connection member 2240 may be formed, an opening 2251 may be formed, and an underbump metal layer 2260, or the like, may be formed. That is, a fan-in semiconductor package 2200 including, for example, the semiconductor chip 2220, the connection member 2240, the passivation layer 2250, and the underbump metal layer 2260 may be manufactured through a series of processes.

As described above, the fan-in semiconductor package may have a package form in which all of the connection pads, for example, input/output (I/O) terminals, of the semiconductor chip, are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has a large spatial limitation. Therefore, it is difficult to apply this structure to a semiconductor chip having a large number of I/O terminals or a semiconductor chip having a compact size. In addition, due to the issues described above, the fan-in semiconductor package may not be directly mounted and used on the mainboard of the electronic device. The reason is that even in a case that a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be sufficient to directly mount the fan-in semiconductor package on the mainboard of the electronic device.

Figure 5:
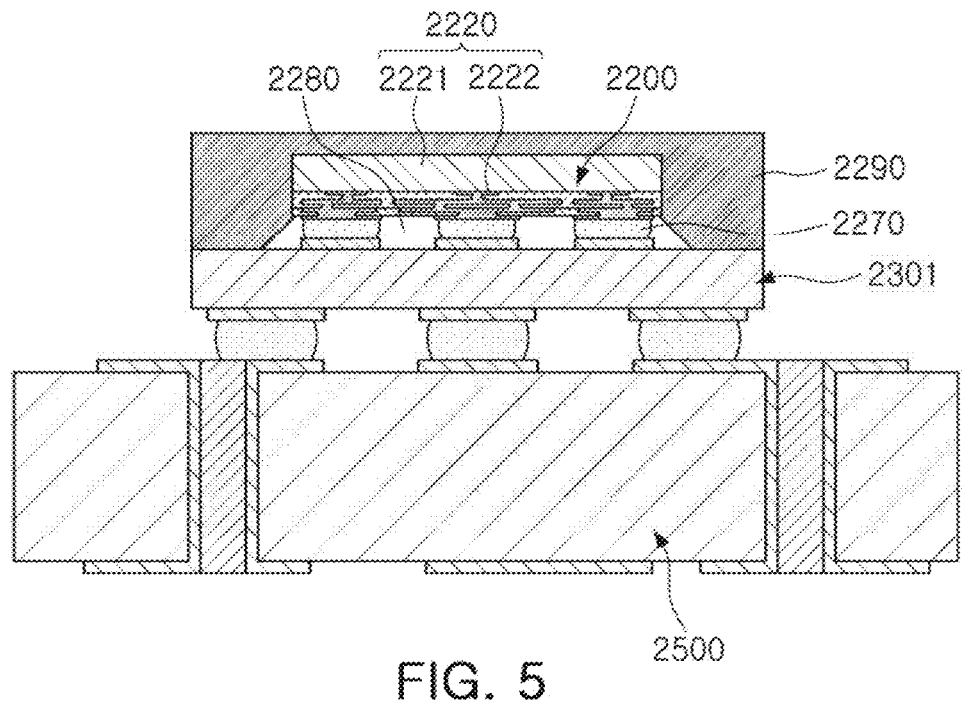
FIG. 5 is a schematic cross-sectional view illustrating a case in which a fan-in semiconductor package is mounted on an interposer substrate and is ultimately mounted on a mainboard of an electronic device.

FIG. 5 is a schematic cross-sectional view illustrating a case in which a fan-in semiconductor package is mounted on an interposer substrate and is ultimately mounted on a mainboard of an electronic device.

Figure 6:
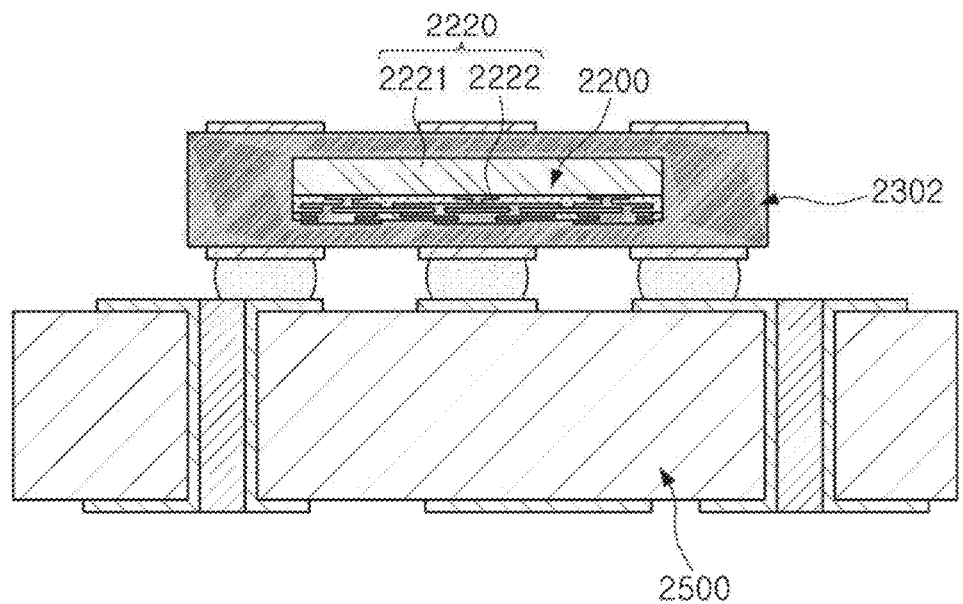
FIG. 6 is a schematic cross-sectional view illustrating a case in which a fan-in semiconductor package is embedded in an interposer substrate and is ultimately mounted on a mainboard of an electronic device.

FIG. 6 is a schematic cross-sectional view illustrating a case in which a fan-in semiconductor package is embedded in an interposer substrate and is ultimately mounted on a mainboard of an electronic device.

Referring to FIGS. 5 and 6, in a fan-in semiconductor package 2200, connection pads 2222, that is, I/O terminals, of a semiconductor chip 2220 may be redistributed through an interposer substrate 2301, and the fan-in semiconductor package 2200 may be ultimately mounted on a mainboard 2500 of an electronic device in a state in which it is mounted on the interposer substrate 2301. In this case, solder balls 2270, and the like, may be fixed by an underfill resin 2280, or the like, and an outer side of the semiconductor chip 2220 may be covered with a molding material 2290, or the like. Alternatively, a fan-in semiconductor package 2200 may be embedded in a separate interposer substrate 2302, connection pads 2222, that is, I/O terminals, of the semiconductor chip 2220 may be redistributed by the interposer substrate 2302 in a state in which the fan-in semiconductor package 2200 is embedded in the interposer substrate 2302, and the fan-in semiconductor package 2200 may be ultimately mounted on a mainboard 2500 of an electronic device.

As described above, it may be difficult to directly mount and use the fan-in semiconductor package on the mainboard of the electronic device. Therefore, the fan-in semiconductor package may be mounted on the separate interposer substrate and be then mounted on the mainboard of the electronic device through a packaging process or may be mounted and used on the mainboard of the electronic device in a state in which it is embedded in the interposer substrate.

Fan-Out Semiconductor Package

Figure 7:
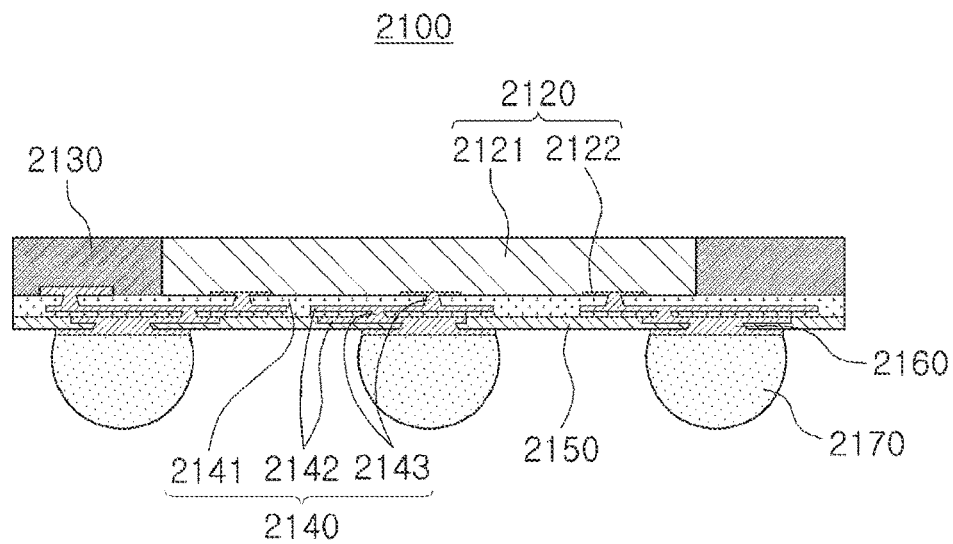
FIG. 7 is a schematic cross-sectional view illustrating a fan-out semiconductor package.

FIG. 7 is a schematic cross-sectional view illustrating a fan-out semiconductor package.

Referring to FIG. 7, in a fan-out semiconductor package 2100, for example, an outer side of a semiconductor chip 2120 is protected by an encapsulant 2130, and connection pads 2122 of the semiconductor chip 2120 are redistributed outwardly of the semiconductor chip 2120 by a connection member 2140. In this case, a passivation layer 2150 is further formed on the connection member 2140, and an underbump metal layer 2160 is further formed in openings of the passivation layer 2150. Solder balls 2170 are further formed on the underbump metal layer 2160. The semiconductor chip 2120 may be an integrated circuit (IC) including a body 2121, the connection pads 2122, a passivation layer (not illustrated), and the like. The connection member 2140 includes an insulating layer 2141, redistribution layers 2142 formed on the insulating layer 2141, and vias 2143 electrically connecting the connection pads 2122 and the redistribution layers 2142 to each other.

As described above, the fan-out semiconductor package may have a form in which I/O terminals of the semiconductor chip are redistributed and disposed outwardly of the semiconductor chip through the connection member formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection member formed on the semiconductor chip as described above. Therefore, even in a case that a size of the semiconductor chip is decreased, a standardized ball layout may be used in the fan-out semiconductor package as it is, such that the fan-out semiconductor package may be mounted on the mainboard of the electronic device without using a separate interposer substrate, as described below.

Figure 8:
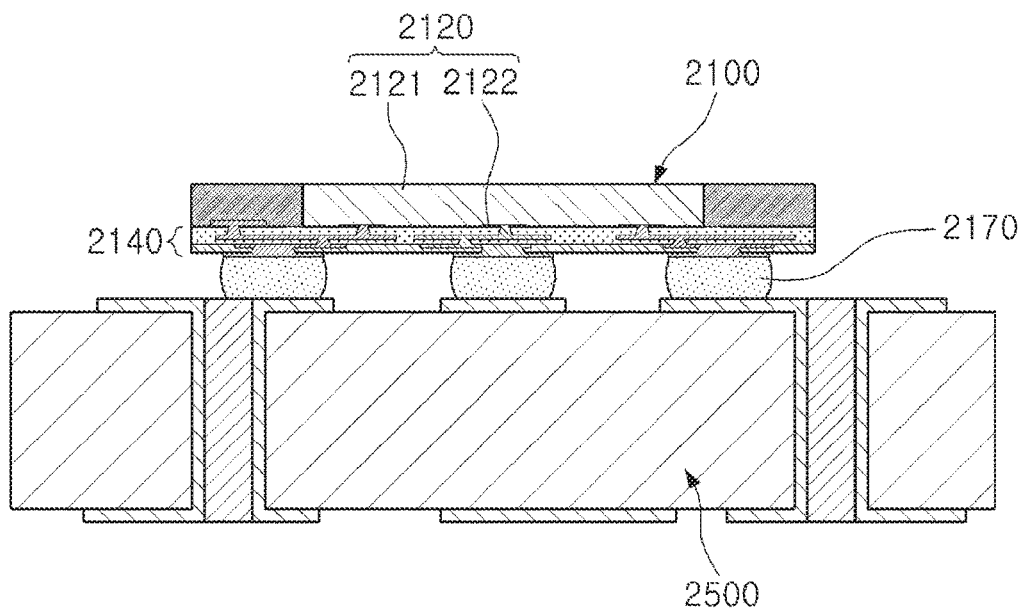
FIG. 8 is a schematic cross-sectional view illustrating a case in which a fan-out semiconductor package is mounted on a mainboard of an electronic device.

FIG. 8 is a schematic cross-sectional view illustrating a case in which a fan-out semiconductor package is mounted on a mainboard of an electronic device.

Referring to FIG. 8, a fan-out semiconductor package 2100 is mounted on a mainboard 2500 of an electronic device through solder balls 2170, or the like. That is, as described above, the fan-out semiconductor package 2100 includes the connection member 2140 formed on the semiconductor chip 2120 and capable of redistributing the connection pads 2122 to a fan-out region that is outside of a size of the semiconductor chip 2120, such that the standardized ball layout may be used in the fan-out semiconductor package 2100 as it is. As a result, the fan-out semiconductor package 2100 may be mounted on the mainboard 2500 of the electronic device without using a separate interposer substrate, or the like.

As described above, since the fan-out semiconductor package may be mounted on the mainboard of the electronic device without using the separate interposer substrate, the fan-out semiconductor package may be implemented at a thickness lower than that of the fan-in semiconductor package using the interposer substrate. Therefore, the fan-out semiconductor package may be miniaturized and thinned. In addition, the fan-out semiconductor package has excellent thermal characteristics and electrical characteristics, such that it is particularly appropriate for a mobile product. Therefore, the fan-out semiconductor package may be implemented in a form more compact than that of a general package-on-package (POP) type using a printed circuit board (PCB), and may solve a problem due to occurrence of a warpage phenomenon.

The fan-out semiconductor package refers to package technology for mounting the semiconductor chip on the mainboard of the electronic device, or the like, as described above, and protecting the semiconductor chip from external impacts, and is a concept different from that of a printed circuit board (PCB) such as an interposer substrate, or the like, having a scale, a purpose, and the like, different from those of the fan-out semiconductor package, and having the fan-in semiconductor package embedded therein.

Composite Antenna Substrate and Semiconductor Package Module

Figure 9:
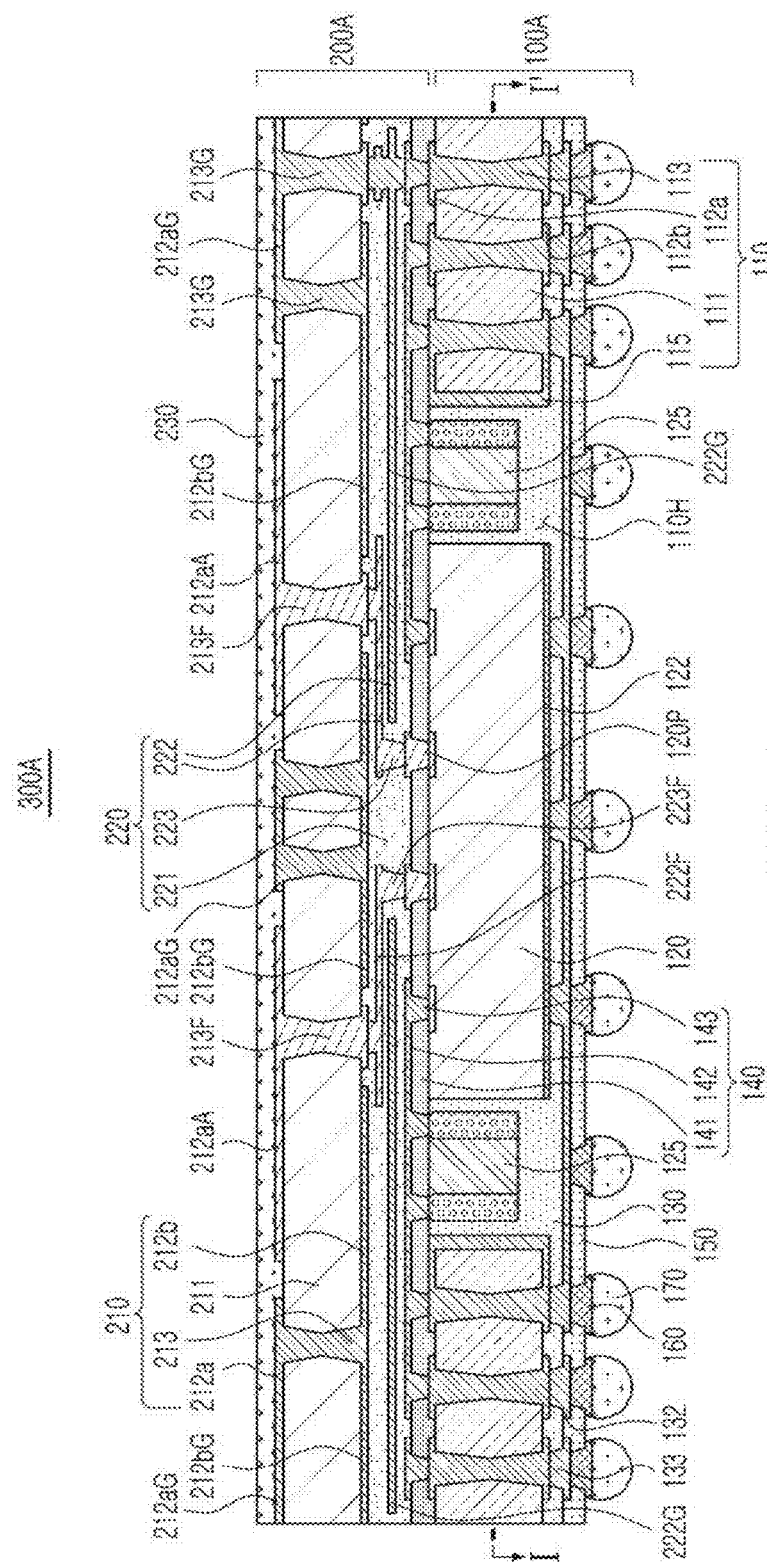
FIG. 9 is a schematic cross-sectional view illustrating an example of a composite antenna substrate and semiconductor package module.

FIG. 9 is a schematic cross-sectional view illustrating an example of a composite antenna substrate and semiconductor package module.

Figure 10:
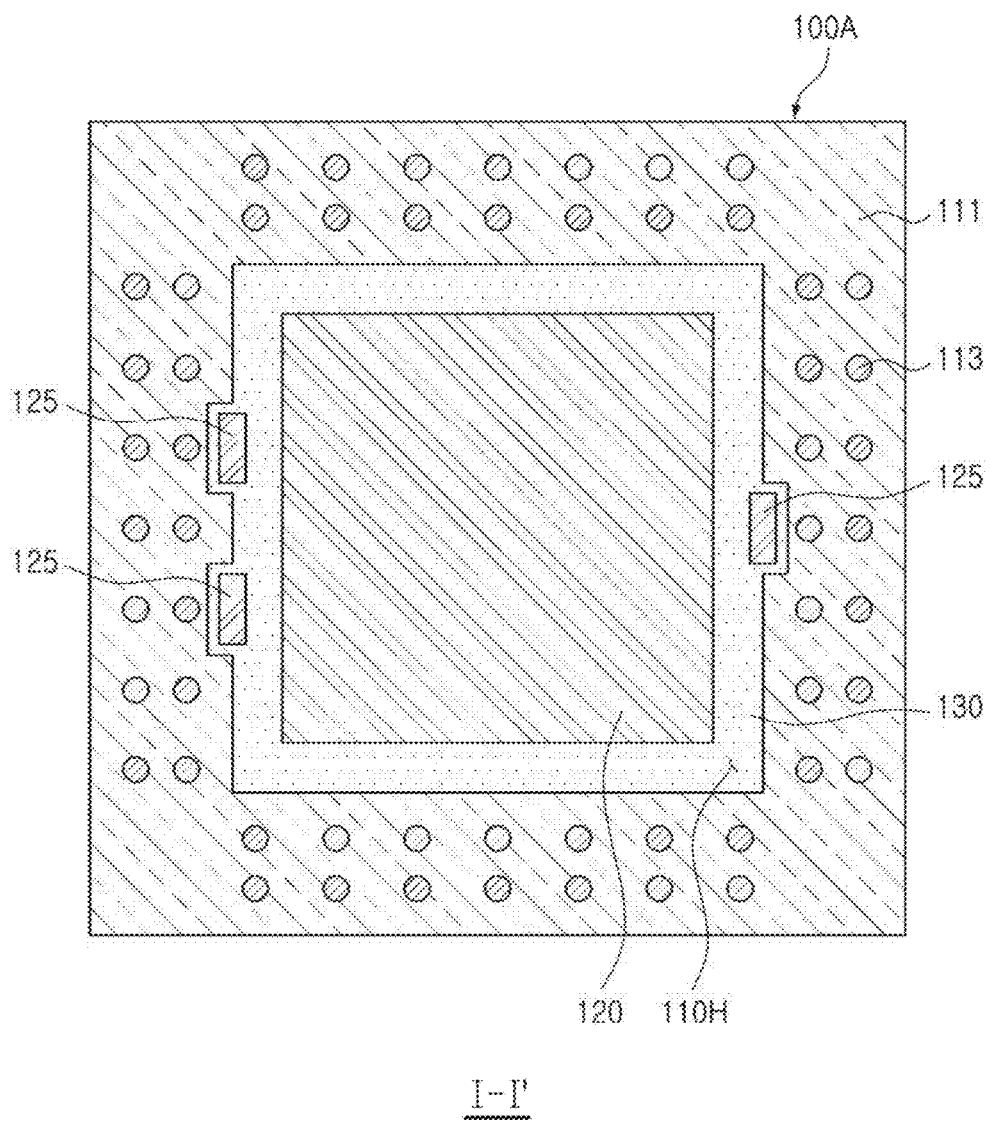
FIG. 10 is a schematic plan view taken along line I-I' of the composite antenna substrate and semiconductor package module of FIG. 9.

FIG. 10 is a schematic plan view taken along line I-I' of the composite antenna substrate and semiconductor package module of FIG. 9.

Referring to FIGS. 9 and 10, a composite antenna substrate and semiconductor package module 300A according to an exemplary embodiment in the present disclosure may have a form in which a fan-out semiconductor package 100A and an antenna substrate 200A are coupled to each other. In more detail, the composite antenna substrate and semiconductor package module 300A may have a form in which the fan-out semiconductor package 100A and the antenna substrate 200A are integrated with each other.

The fan-out semiconductor package 100A includes a core member 110 having a through-hole 110H, a semiconductor chip 120 disposed in the through-hole 110H and having an active surface having connection pads 120P disposed thereon and an inactive surface opposing the active surface, passive components 125 disposed adjacent to the semiconductor chip 120 in the through-hole 110H. The fan-out semiconductor package 100A further includes an encapsulant 130 encapsulating at least portions of the core member 110, the semiconductor chip 120, and the passive components 125. A connection member 140 is disposed on the active surface of the semiconductor chip 120. A backside wiring layer 132 is disposed on the inactive surface of the semiconductor chip 120 and the core member 110. A passivation layer 150 is disposed beneath the encapsulant 130. An underbump metal layer 160 is connected to the backside wiring layer 132, and electrical connection structures 170 are connected to the underbump metal layer. The core member 110 includes core wiring layers 112a and 112b and the connection member 140 includes redistribution layers 142 electrically connected to the connection pads 120P. In an embodiment, the semiconductor chip 120 may be disposed in face-up form toward the antenna substrate 200A.

The antenna substrate 200A includes an antenna member 210 in which a first pattern layer 212a including antenna patterns 212aA is disposed on an upper surface of an insulating layer 211, a second pattern layer 212b including ground patterns 212bG is disposed on a lower surface of the insulating layer, and vias 213 penetrating through the insulating layer 211 and including feed lines 213F electrically connected to the antenna patterns 212aA are formed in the insulating layer 211. The antenna substrate 200A further includes a wiring member 220 disposed below the antenna member 210 and including wiring layers 222 including feeding patterns 222F electrically connected to the feed lines 213F. A passivation layer 230 is disposed on the antenna member 210 and covering the first wiring layer 212a. In an embodiment, the antenna member 210 may be thicker than the wiring member 220.

The wiring member 220 of the antenna substrate 200A and the connection member 140 of the fan-out semiconductor package 100A are in contact and are integrated with each other without using separate electrical connection structures, or the like. The expression "coupling" conceptually includes a case in which two components are integrated with each other to be in contact with each other and a form in which two components are stacked using an intermediary.

In a case in which an RFIC and an antenna are formed as one composite module, it needs to be considered how to implement an antenna, a ground face, a dielectric material, feed lines, and the like, in order to determine a resonance frequency and a bandwidth of the antenna. For example, a distance between the antenna and the ground face that has a sensitive influence on characteristics of the antenna, that is, a thickness of an air layer or a thickness of a dielectric material, needs to be constantly maintained and managed in order to secure stable radiation characteristics of the antenna.

In a case of the related art, a manner of forming an antenna on a redistribution layer a semiconductor package and forming a ground face on a mainboard has been used. In this case, the thickness or the distance between the antenna and the ground face needs to be secured by a height by solder balls of the package. Therefore, when the mainboard is mounted on the package, a thickness difference may be generated depending on a height level at which the solder balls collapse. In addition, in this case, a dielectric material is used as a material of the air layer, and a size of the antenna is thus increased. In addition, in this case, a flux or a foreign material may be inserted into a space between the antenna and the ground face, significantly influencing the characteristics of the antenna. In addition, in this case, when heat is generated in the RFIC, it is difficult to secure a sufficient heat dissipation path, and thus, there is a limitation in using such a manner in a product that uses a large amount of power.

On the other hand, the composite antenna substrate and semiconductor package module 300A according to an exemplary embodiment may have a structure in which the fan-out semiconductor package 100A (in which the semiconductor chip 120 such as the RFIC, or the like, is packaged in face-up form) is integrated with the antenna substrate 200A including the antenna patterns 212aA such as a dipole antenna, a patch antenna, or the like. In this case, the antenna member 210 may be introduced into the antenna substrate 200A. The antenna member 210 may include the antenna patterns 212aA and the ground patterns 212bG formed on opposite surfaces of the insulating layer 211, respectively, and include the feed lines 213F implemented through the vias 213, and the like, penetrating through the insulating layer 211. Therefore, the distance between the antenna and the ground face may be stably secured in a single composite module regardless of a change in an external environment to maintain radiation characteristics of the antenna, and in addition, a signal path between the antenna and the semiconductor chip may be significantly reduced to secure stable radio frequency (RF) characteristics.

Further, a size of the antenna may be reduced by appropriately using a dielectric constant (Dk) of the insulating layer 211 of the antenna member 210 and a dielectric constant (Dk) of a dielectric layer 111 of the core member 110 to simplify the entire structure of the composite antenna substrate and semiconductor package module, resulting in improvement of spatial efficiency and reduction of a cost. Furthermore, deterioration of the performance of the antenna due to an influence of foreign materials in the space between the antenna and the ground face may also be prevented. In addition, rigidity of the composite antenna substrate and semiconductor package module 300A may be improved by introduction of the core member 110, and the core member 110 may provide an electrical connection path to effectively provide a signal path in the composite antenna substrate and semiconductor package module up to the electrical connection structures 170 for being connected to the mainboard, or the like. The passive components 125 may be embedded together with the semiconductor chip 120 in the fan-out semiconductor package 100A to significantly reduce loss of signals, power, and the like.

Components of the composite antenna substrate and semiconductor package module 300A according to an exemplary embodiment will hereinafter be described in more detail with reference to the drawings.

First, the fan-out semiconductor package 100A includes the core member 110 having the through-hole 110H, the semiconductor chip 120 disposed in the through-hole 110H and having the active surface having the connection pads 120P disposed thereon and the inactive surface opposing the active surface. The fan-out semiconductor package 100A further includes the passive components 125 disposed adjacent to the semiconductor chip 120 in the through-hole 110H, and the encapsulant 130 encapsulating at least portions of the core member 110, the semiconductor chip 120, and the passive components 125. The connection member 140 is disposed on the active surface of the semiconductor chip 120. The backside wiring layer 132 is disposed on the inactive surface of the semiconductor chip 120 and the core member 110. The passivation layer 150 is disposed below the encapsulant 130. The underbump metal layer 160 is connected to the backside wiring layer 132, and the electrical connection structures 170 are connected to the underbump metal layer, as described above. The core member 110 includes the core wiring layers 112a and 112b and the connection member 140 includes the redistribution layers 142 electrically connected to the connection pads 120P.

The core member 110 may include the core wiring layers 112a and 112b to thus reduce the number of layers of the connection member 140. If necessary, appropriate material may be selected for the core member 110 to improve rigidity of the fan-out semiconductor package 100A depending on certain materials, and to secure uniformity of a thickness of the encapsulant 130. An electrical path may be provided in the composite antenna substrate and semiconductor package module 300A by the core wiring layers 112a and 112b and core vias 113 of the core member 100. The core member 110 may have the through-hole 110H. The semiconductor chip 120 and the passive components 125 may be disposed side by side in the through-hole 110H to be spaced apart from the core member 110 by a predetermined distance. Side surfaces of the semiconductor chip 120 and the passive components 125 may be surrounded by the core member 110. However, such a form is only an example and the present embodiment may be variously modified to have other forms, and the core member 110 may perform another function depending on such a form.

The core member 110 may include the dielectric layer 111, a first core wiring layer 112a disposed on an upper surface of the dielectric layer 111, a second core wiring layer 112b disposed on a lower surface of the dielectric layer 111, and the core vias 113 penetrating through the dielectric layer 111 and connecting the first and second core wiring layers 112a and 112b to each other. The first and second core wiring layers 112a and 112b of the core member 110 may have a thickness greater than that of the redistribution layers 142 of the connection member 140. Since the core member 110 may have a thickness similar to or greater than that of the semiconductor chip 120, or the like, the first and second core wiring layers 112a and 112b may be formed to have large sizes through a substrate process depending on a scale of the core member 110. On the other hand, the redistribution layers 142 of the connection member 140 may be formed at small sizes through a semiconductor process for thinness.

A material of the dielectric layer 111 is not particularly limited. For example, an insulating material may be used as the material of the dielectric layer 111. In this case, the insulating material may be a thermosetting resin such as an epoxy resin, a thermoplastic resin such as a polyimide resin, a resin in which the thermosetting resin or the thermoplastic resin is impregnated together with an inorganic filler in a core material such as a glass fiber (or a glass cloth or a glass fabric), for example, prepreg, Ajinomoto Build up Film (ABF), FR-4, Bismaleimide Triazine (BT), or the like. Alternatively, a PID resin may also be used as the insulating material. For example, a general copper clad laminate (CCL) of low Df and low Dk or a glass or a ceramic-based insulating material of low Df and high Dk may be used as a material of the dielectric layer 111, depending on characteristics of a required material.

The core wiring layers 112a and 112b may serve to redistribute the connection pads 120P of the semiconductor chip 120. In addition, the core wiring layers 112a and 112b may be used as connection patterns when the fan-out semiconductor package 100A is electrically connected to other components disposed on and below the fan-out semiconductor package 100A. A material of each of the core wiring layers 112a and 112b may be a conductive material such as copper (Cu), aluminum (Al), silver (Ag), tin (Sn), gold (Au), nickel (Ni), lead (Pb), titanium (Ti), or alloys thereof. The core wiring layers 112a and 112b may perform various functions depending on designs of their corresponding layers. For example, the core wiring layers 112a and 112b may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the core wiring layers 112a and 112b may include via pads, and the like.

The core vias 113 may electrically connect the core wiring layers 112a and 112b formed on different layers to each other, resulting in an electrical path in the core member 110. A material of each of the core vias 113 may be a conductive material such as copper (Cu), aluminum (Al), silver (Ag), tin (Sn), gold (Au), nickel (Ni), lead (Pb), titanium (Ti), or alloys thereof. Each of the core vias 113 may be entirely filled with the conductive material, or the conductive material may be formed along a wall of respective via holes. In addition, each of the core vias 113 may have any known shape such as an hourglass shape, a cylindrical shape, and the like. The core vias 113 may also include vias for signal, and vias for ground, and the like.

A metal layer 115 may be further disposed on a wall of the through-hole 110H of the core member 110, if necessary. The metal layer 115 may be formed over the entire wall of the through-hole 110H to surround the semiconductor chip 120. Therefore, heat dissipation characteristics may be improved, and an electromagnetic wave blocking effect may be accomplished. A material of the metal layer 115 may be a conductive material such as copper (Cu), aluminum (Al), silver (Ag), tin (Sn), gold (Au), nickel (Ni), lead (Pb), titanium (Ti), or alloys thereof. The metal layer 115 may be electrically connected to ground patterns of the first core wiring layer 112a and/or the second core wiring layer 112b to be thus used as a ground face.

The semiconductor chip 120 may be an integrated circuit (IC) in a bare state, provided in an amount of several hundreds to several millions of elements or more integrated in a single chip. The integrated circuit (IC) may be, for example, a radio frequency integrated circuit (RFIC). That is, the composite antenna substrate and semiconductor package module 300A according to an exemplary embodiment may be a package in which the RFIC and a millimeter wave/5G antenna are integrated with each other. The semiconductor chip 120 may include a body on which various circuits are formed, and the connection pads 120P may be formed on an active surface of the body. The body may be formed on the basis of, for example, an active wafer. In this case, silicon (Si), germanium (Ge), gallium arsenide (GaAs), or the like, may be used as a basic material of the body. The connection pads 120P may electrically connect the semiconductor chip 120 to other components, and a material of each of the connection pads 120P may be a conductive material such as aluminum (Al), but is not limited thereto. The active surface of the semiconductor chip 120 refers to a surface of the semiconductor chip 120 on which the connection pads 120P are disposed, and the inactive surface of the semiconductor chip 120 refers to a surface of the semiconductor chip 120 opposing the active surface. Although not illustrated in the drawings, a passivation layer (not illustrated) having openings exposing at least portions of the connection pads 120P and formed of an oxide layer, a nitride layer, or the like, may be formed on the active surface of the semiconductor chip 120. The semiconductor chip 120 may be disposed in face-up form to thus have a shortest signal path up to the antenna.

The passive components 125 may be disposed side by side with the semiconductor chip 120 in the through-hole 110H. The passive components 125 may be the known passive components such as capacitors, inductors, or the like. As a non-restrictive example, the passive components 125 may be capacitors. The passive components 125 may be electrically connected to the semiconductor chip 120 through the connection member 140. In addition, the passive components 125 may also be electrically connected to the antenna substrate 200A through the connection member 140. The number of passive components 125 is not particularly limited.

The encapsulant 130 may be configured to protect the semiconductor chip 120, the passive components 125, and the like, and provide an insulating region. An encapsulation form of the encapsulant 130 is not particularly limited, but may be a form in which the encapsulant 130 surrounds at least portions of the semiconductor chips 120 and the passive components 125. For example, the encapsulant 130 may cover a lower surface of the core member 110, cover side surfaces and the inactive surface of the semiconductor chip 120, and cover side surfaces and lower surfaces of the passive components 125. In addition, the encapsulant 130 may fill a space in the through-hole 110H. A certain material of the encapsulant 130 is not particularly limited, but may be, for example, a photoimagable encapsulant (PIE). Alternatively, an insulating material such as ABF, or the like, may be used, if necessary.

The backside wiring layer 132 serve to redistribute the connection pads 120P of the semiconductor chip 120, and a material of the backside wiring layer 132 may be a conductive material such as copper (Cu), aluminum (Al), silver (Ag), tin (Sn), gold (Au), nickel (Ni), lead (Pb), titanium (Ti), or alloys thereof. The backside wiring layer 132 may perform various functions depending on a design of the corresponding layer. For example, the backside wiring layer 132 may include ground patterns, signal patterns, and the like. In addition, the backside wiring layer 132 may include via pads, electrical connection structures pads, and the like.

Backside vias 133 electrically connect the backside wiring layer 132, the second core wiring layer 112b, and the like, formed on different layers to each other. In addition, the backside vias 133 may be connected to a metal layer 122 formed on the inactive surface of the semiconductor chip 120 to be thus utilized as heat dissipation vias, if necessary. A material of each of the backside vias 133 may be a conductive material such as copper (Cu), aluminum (Al), silver (Ag), tin (Sn), gold (Au), nickel (Ni), lead (Pb), titanium (Ti), or alloys thereof. The each of backside vias 133 may be entirely filled with the conductive material, or the conductive material may also be formed along a wall of each of the backside vias. In addition, each of the backside vias 133 may have any known shape, such as a tapered shape, a cylindrical shape, or the like.

The connection member 140 redistributes the connection pads 120P of the semiconductor chip 120. Several tens to several hundreds of connection pads 120P of the semiconductor chip 120 having various functions may be redistributed by the connection member 140. In addition, the connection member 140 may be connected to the wiring member 220 to thus provide a connection path so that the fan-out semiconductor package 100A and the antenna substrate 200A may be integrated with each other. The connection member 140 may include insulating layers 141, the redistribution layers 142 disposed on the insulating layers 141, and the vias 143 penetrating through the insulating layers 141 and connected to the redistribution layers 142. The connection member 140 may be formed of a single layer, or may be formed of a plurality of layers of which the number is greater than that illustrated in the drawings.

A material of each of the insulating layers 141 may be an insulating material. In this case, a photosensitive insulating material such as a PID resin may also be used as the insulating material. That is, the insulating layer 141 may be a photosensitive insulating layer. When the insulating layer 141 has photosensitive properties, the insulating layer 141 may be formed to have a lower thickness, and a fine pitch of the via 143 may be achieved more easily. The insulating layer 141 may be a photosensitive insulating layer including an insulating resin and an inorganic filler. When the insulating layers 141 are multiple layers, materials of the insulating layers 141 may be the same as each other, and may also be different from each other, if necessary. When the insulating layers 141 are the multiple layers, the insulating layers 141 may be integrated with each other depending on a process, such that a boundary therebetween may also not be apparent.

The redistribution layers 142 may serve to substantially redistribute the connection pads 120P. A material of each of the redistribution layers 142 may be a conductive material such as copper (Cu), aluminum (Al), silver (Ag), tin (Sn), gold (Au), nickel (Ni), lead (Pb), titanium (Ti), or alloys thereof. The redistribution layers 142 may perform various functions depending on designs of their corresponding layers. For example, the redistribution layers 142 may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the redistribution layers 142 may include via pads, connection terminal pads, and the like. The redistribution layers 142 may include feeding patterns electrically connected to feed lines 223F.

The vias 143 may electrically connect the redistribution layers 142, the connection pads 120, or the like, formed on different layers to each other, resulting in an electrical path in the fan-out semiconductor package 100A. A material of each of the vias 143 may be a conductive material such as copper (Cu), aluminum (Al), silver (Ag), tin (Sn), gold (Au), nickel (Ni), lead (Pb), titanium (Ti), or alloys thereof. Each of the vias 143 may be entirely filled with the conductive material, or the conductive material may also be formed along a wall of each of the vias. In addition, each of the vias 143 may have any shape known in the related art, such as a tapered shape, a cylindrical shape, and the like. The vias 143 may include feed lines electrically connected to the feed lines 223F.

The passivation layer 150 may protect the backside wiring layer 132 from external physical or chemical damage. The passivation layer 150 may include an insulating resin and an inorganic filler, but may not include a glass fiber. For example, the passivation layer 150 may be formed of an ABF. However, the passivation layer 150 is not limited thereto, but may also be formed of a PID, a solder resist, or the like.

The underbump metal layer 160 may improve connection reliability of the electrical connection structures 170 to improve board level reliability of the fan-out semiconductor package 100A. The underbump metal layer 160 may be connected to various pads for electrical connection structures of the backside wiring layer 132 exposed through openings of the encapsulant 130 and/or the passivation layer 150. The underbump metal layer 160 may be formed in the openings of the encapsulant 130 by a known metallization method using a known conductive material such as a metal, but is not limited thereto.

The electrical connection structures 170 may be additionally configured to physically or electrically externally connect the fan-out semiconductor package 100A. For example, the fan-out semiconductor package 100A may be mounted on the mainboard of the electronic device through the electrical connection structures 170. Each of the electrical connection structures 170 may be formed of a conductive material, for example, a solder, or the like. However, this is only an example, and a material of each of the electrical connection structures 170 is not limited thereto. Each of the electrical connection structures 170 may be a land, a ball, a pin, or the like. The electrical connection structures 170 may be formed as a multilayer or single layer structure. When the electrical connection structures 170 are formed as a multilayer structure, the electrical connection structures 170 may include a copper (Cu) pillar and a solder. When the electrical connection structures 170 are formed as a single layer structure, the electrical connection structures 170 may include a tin-silver solder or copper (Cu). However, this is only an example, and the electrical connection structures 170 are not limited thereto. The number, an interval, a disposition form, and the like, of electrical connection structures 170 are not particularly limited, but may be sufficiently modified depending on design particulars by those skilled in the art. For example, the electrical connection structures 170 may be provided in an amount of several tens to several thousands according to the number of connection pads 120P, or may be provided in an amount of several tens to several thousands or more or several tens to several thousands or less.

At least one of the electrical connection structures 170 may be disposed in a fan-out region. The fan-out region is a region except for a region in which the semiconductor chip 120 is disposed. The fan-out package may have excellent reliability as compared to a fan-in package, may implement a plurality of input/output (I/O) terminals, and may facilitate a 3D interconnection. In addition, as compared to a ball grid array (BGA) package, a land grid array (LGA) package, or the like, the fan-out package may be manufactured to have a small thickness, and may have price competitiveness.

Next, the antenna substrate 200A may include the antenna member 210 in which the first pattern layer 212*a* including the antenna patterns 212*a*A is disposed on the upper surface of the insulating layer 211, the second pattern layer 212*b* including the ground patterns 212*b*G is disposed on the lower surface of the insulating layer, and the vias 213 penetrating through the insulating layer 211 and including the feed lines 213F electrically connected to the antenna patterns 212*a*A are formed in the insulating layer 211, the wiring member 220 disposed below the antenna member 210 and including the wiring layers 222 including the feeding patterns 222F electrically connected to the feed lines 213F, and the passivation layer 230 disposed on the antenna member 210 and covering the first wiring layer 212*a*. The antenna member 210 may be thicker than the wiring member 220. The wiring member 220 and the connection member 140 may be in contact with each other without using separate electrical connection structures, or the like. The antenna substrate 200A may have an asymmetrical structure in relation to the antenna member 210.

The antenna member 210, which is a region capable of implementing a millimeter wave/5G antenna, may include the insulating layer 211, the first pattern layer 212*a* formed on the upper surface of the insulating layer, the second pattern layer 212*b* formed on the lower surface of the insulating layer 211, and the vias 213 penetrating through the insulating layer 211 and electrically connecting the first and second pattern layers 212*a* and 212*b* to each other. In the antenna member 210, the first pattern layer 212*a* may include the antenna patterns 212*a*A, the second pattern layer 212*b* may include the ground patterns 212*b*G, and the insulating layer 211 may be disposed between the first pattern layer 212*a* and the second pattern layer 212*b*. Therefore, the distance between the antenna and the ground face may be stably secured in a single composite module regardless of a change in an external environment to maintain radiation characteristics of the antenna. In addition, the size of the antenna may be reduced by appropriately using the dielectric constant (Dk) of the insulating layer 211 to simplify the entire structure of the composite antenna substrate and semiconductor package module, resulting in the improvement of the spatial efficiency and the reduction of the cost. For example, the dielectric constant (Dk) of the insulating layer 211 of the antenna member 210 may be greater than the dielectric constant (Dk) of the dielectric layer 111 of the core member 110. The dielectric constant (Dk) of the insulating layer 211 of the antenna member 210 may be greater than that of another insulating layer or dielectric layer in the composite antenna substrate and semiconductor package module 300A.

An insulating material may be used as a material of the insulating layer 211. In this case, the insulating material may be a thermosetting resin such as an epoxy resin, a thermoplastic resin such as a polyimide resin, a material including a reinforcing material such as a glass fiber (or a glass cloth or a glass fabric) and/or an inorganic filler together with the thermosetting resin and the thermoplastic resin, for example, prepreg, ABF, FR-4, BT, or the like. For example, a general CCL of low Df and low Dk or a glass or a ceramic-based insulating material of low Df and high Dk may be used as a material of the insulating layer 211, depending on the desired characteristics for the insulating material. When a glass or a ceramic-based material of high Dk and low Df is used as the material of the insulating layer 211, the antenna may be formed at a smaller size. A thickness of the insulating layer 211 may be freely changed depending on impedance matching characteristics.

The first wiring layer 212a may include the antenna patterns 212aA substantially implementing the millimeter wave/5G antenna, and may include other ground patterns 212aG, and the like. The antenna patterns 212aA may be a dipole antenna, a patch antenna, or the like. The antenna patterns 212aA may be surrounded by ground patterns, but are not limited thereto. A material of the first wiring layer 212a may be a conductive material such as copper (Cu), aluminum (Al), silver (Ag), tin (Sn), gold (Au), nickel (Ni), lead (Pb), titanium (Ti), or alloys thereof.

The second wiring layer 212b may include the ground patterns 212bG for the antenna patterns 212aA, and may include other signal patterns, and the like. The ground patterns 212bG may have a form of the ground face. A material of the second wiring layer 212b may be a conductive material such as copper (Cu), aluminum (Al), silver (Ag), tin (Sn), gold (Au), nickel (Ni), lead (Pb), titanium (Ti), or alloys thereof.

The vias 213 may electrically connect the first and second wiring layers 212a and 212b formed on different layers to each other, resulting in an electrical path in the antenna member 210. The vias 213 may include the feed lines 213F, and may include other ground vias 213G, and the like. The feed lines 213F may be electrically connected to the antenna patterns 212aA. The ground vias 213G may densely surround the feed lines 213F. A material of each of the vias 213 may be a conductive material such as copper (Cu), aluminum (Al), silver (Ag), tin (Sn), gold (Au), nickel (Ni), lead (Pb), titanium (Ti), or alloys thereof. Each of the vias 213 may be entirely filled with the conductive material, or the conductive material may be formed along a wall of each of via holes unlike illustrated in the drawings. In addition, each of the vias 213 may have any known vertical cross-sectional shape, such as a tapered shape, a cylindrical shape, or the like.

The wiring member 220 may include insulating layers 221, the wiring layers 222 formed on the insulating layers 221, and vias 223 penetrating through the insulating layers 221 and electrically connecting the wiring layers 222 formed on different layers to each other or electrically connecting the wiring layers 222 to a pattern layer or a redistribution layer of another member. The wiring member 220 may have a larger number of wiring layers or have only one wiring layer.

A material of each of the insulating layers 221 may be an insulating material. In this case, ABF, PID, or the like, may be used as the insulating material. When the number of insulating layers 221 is plural, a boundary between the insulating layers 221 may not be apparent, but is not necessarily limited thereto.

The wiring layers 222 may include the feeding patterns 222F electrically connected to the feed lines 213F, and may include other ground patterns 222G, and the like. A material of each of the wiring layers 222 may be a conductive material such as copper (Cu), aluminum (Al), silver (Ag), tin (Sn), gold (Au), nickel (Ni), lead (Pb), titanium (Ti), or alloys thereof.

The vias 223 may electrically connect the wiring layers 222 formed on the different layers to each other or electrically connect the wiring layers 222 to the pattern layer or the redistribution layer of another member to provide an electrical path. The vias 223 may include the feed lines 223F electrically connected to the feeding patterns 222F. A material of each of the vias 223 may be a conductive material such as copper (Cu), aluminum (Al), silver (Ag), tin (Sn), gold (Au), nickel (Ni), lead (Pb), titanium (Ti), or alloys thereof.

The passivation layer 230 may protect the antenna member 210 from external physical or chemical damage. The passivation layer 230 may include an insulating resin and an inorganic filler, but may not include a glass fiber. For example, the passivation layer 230 may be formed of an ABF. However, the passivation layer 230 is not limited thereto, but may also be formed of a PID, a solder resist, or the like.

Figure 11A:
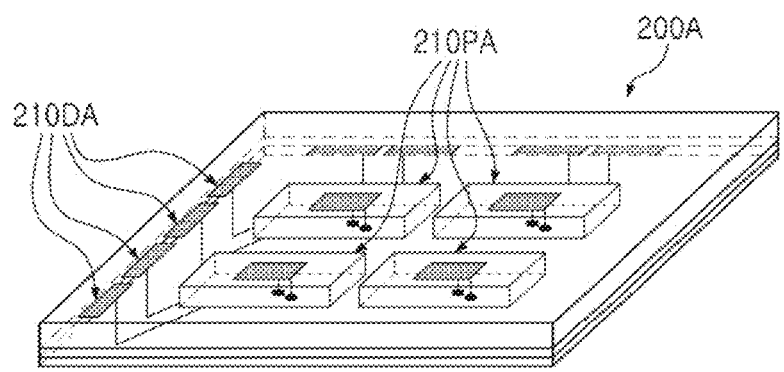
FIGS. 11A and 11B are schematic views illustrating various examples of an antenna substrate of the composite antenna substrate and semiconductor package module of FIG. 9.
Figure 11B:
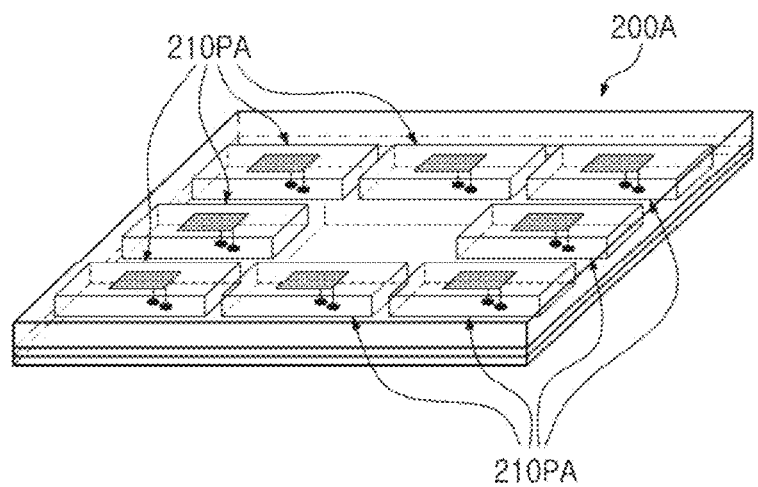

FIGS. 11A and 11B are schematic views illustrating various examples of an antenna substrate of the composite antenna substrate and semiconductor package module of FIG. 9.

Referring to FIGS. 11A and 11B, the antenna substrate 200A may have a form in which it includes a plurality of dipole antennas 210DA and a plurality of patch antennas 210PA. Alternatively, the antenna substrate 200A may have a form in which it includes a larger number of patch antennas 210PA. That is, the antenna substrate 200A may include various types of antennas depending on a design.

Figure 12:
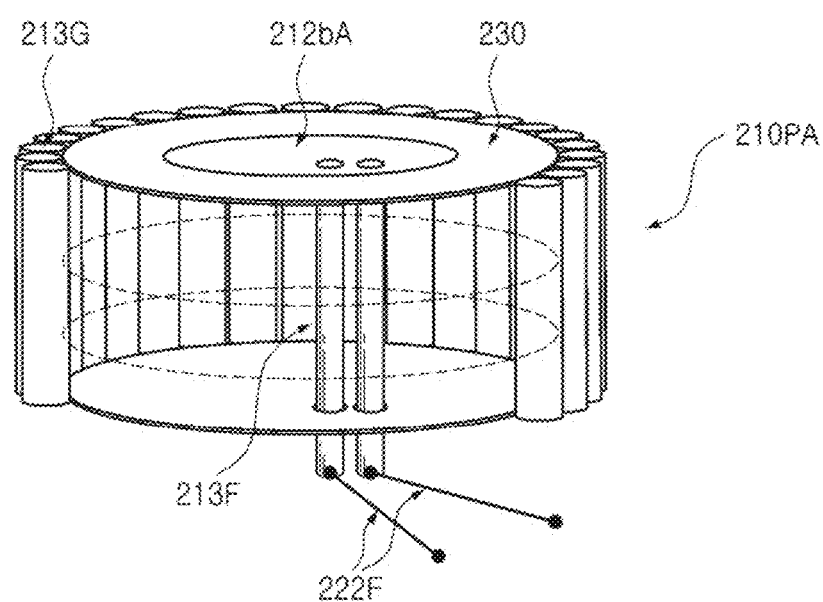
FIG. 12 is a schematic view illustrating an application of a patch antenna of the antenna substrate of the composite antenna substrate and semiconductor package module of FIG. 9.

FIG. 12 is a schematic view illustrating an application of a patch antenna of the antenna substrate of the composite antenna substrate and semiconductor package module of FIG. 9.

Referring to FIG. 12, the patch antenna 210PA may have a form in which the antenna pattern 212bA and the feed lines 213F are surrounded by the ground vias 213G that are densely formed. An insulating material such as the passivation layer 230, or the like, may be further disposed between the antenna pattern 212bA and the ground vias 213G. The feed lines 213F may be electrically connected to the feeding patterns 223F. Resultantly, the feed lines 213F may be electrically connected to the connection pads 120P.

Figure 13:
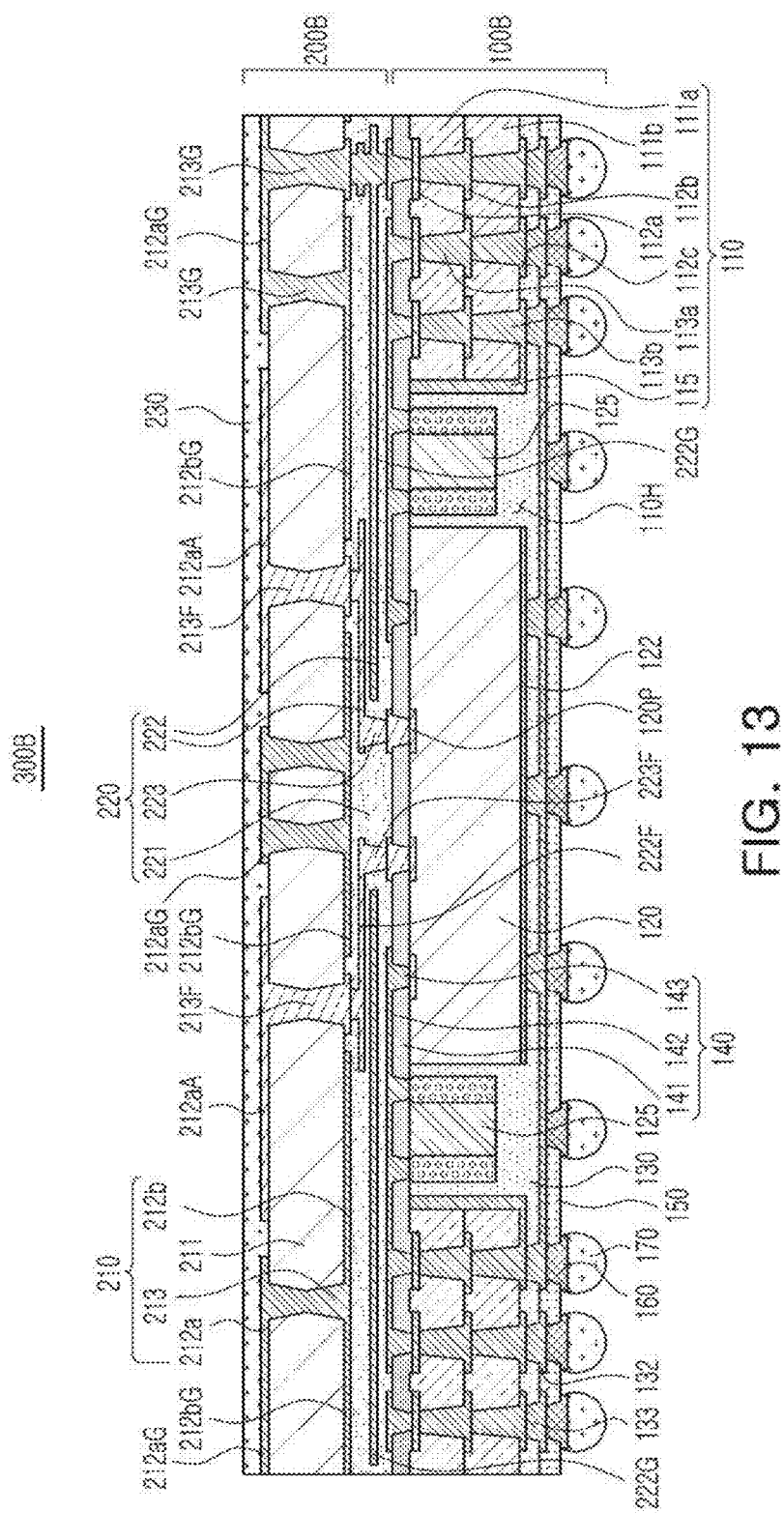
FIG. 13 is a schematic cross-sectional view illustrating another example of a composite antenna substrate and semiconductor package module.

FIG. 13 is a schematic cross-sectional view illustrating another example of a composite antenna substrate and semiconductor package module.

Referring to FIG. 13, a composite antenna substrate and semiconductor package module 300B according to another exemplary embodiment in the present disclosure may have a form in which an antenna substrate 200B and a semiconductor package 100B are integrated with each other. In this case, in the semiconductor package 100B, a core member 110 may include a first dielectric layer 111a in contact with a connection member 140, a first core wiring layer 112a in contact with the connection member 140 and embedded in the first dielectric layer 111a, a second core wiring layer 112b disposed on the other surface of the first dielectric layer 111a opposing one surface of the first dielectric layer 111a in which the first core wiring layer 112a is embedded, a second dielectric layer 111b disposed on the first dielectric layer 111a and covering the second core wiring layer 112b, and a third core wiring layer 112c disposed on the second dielectric layer 111b. The first to third core wiring layers 112a, 112b, and 112c may be electrically connected to connection pads 120. The first and second core wiring layers 112a and 112b and the second and third core wiring layers 112b and 112c may be electrically connected to each other through first and second core vias 113a and 113b penetrating through the first and second dielectric layers 111a and 111b, respectively. Meanwhile, at least one of the first to third core wiring layers 112a, 112b, and 112c may include filter patterns (not illustrated) electrically connected to antenna patterns 212aA. In this case, a material having a high dielectric constant may be used as an insulating material of an antenna member 210 in order to miniaturize an antenna, and a material having a low dielectric constant may be used as an insulating material of the core member 110 in order to significantly reduce loss of a filter. However, the insulating materials of the antenna member 210 and the core member 110 are not limited thereto.

When the first core wiring layer 112a is embedded in the first dielectric layer 111a, a step generated due to a thickness of the first core wiring layer 112a may be significantly reduced, and an insulating distance of the connection member 140 may thus become constant. That is, a difference between a distance from a first redistribution layer 142a of the connection member 140 to a lower surface of the first dielectric layer 111a and a distance from the first redistribution layer 142a of the connection member 140 to the connection pad 120 of a semiconductor chip 120 may be smaller than a thickness of the first core wiring layer 112a. Therefore, a high density wiring design of the connection member 140 may be easy.

A distance between a redistribution layer 142 of the connection member 140 and the first core wiring layer 112a of the core member 110 may be greater than that between the redistribution layer 142 of the connection member 140 and the connection pad 120P of the semiconductor chip 120. The reason is that the first core wiring layer 112a may be recessed into the first dielectric layer 111a. As described above, when the first core wiring layer 112a is recessed into the first dielectric layer 111a, such that an upper surface of the first dielectric layer 111a and an upper surface of the first core wiring layer 112a have a step therebetween, a phenomenon in which a material of the encapsulant 130 bleeds to pollute the first core wiring layer 112a may be prevented. The second core wiring layer 112b of the core member 110 may be disposed on a level between an active surface and an inactive surface of the semiconductor chip 120. The core member 110 may be formed to have a thickness corresponding to that of the semiconductor chip 120. Therefore, the second core wiring layer 112b formed in the core member 110 may be disposed on the level between the active surface and the inactive surface of the semiconductor chip 120.

Thicknesses of the core wiring layers 112a, 112b, and 112c of the core member 110 may be greater than those of the redistribution layers 142 of the connection member 140. Since the core member 110 may have a thickness equal to or greater than that of the semiconductor chip 120, the core wiring layers 112a, 112b, and 112c may be formed at large sizes depending on a scale of the core member 110. On the other hand, the redistribution layers 142 of the connection member 140 may be formed at sizes relatively smaller than those of the core wiring layers 112a, 112b, and 112c for thinness.

A material of each of the dielectric layers 111a and 111b is not particularly limited. For example, an insulating material may be used as the material of each of the dielectric layers 111a and 111b. In this case, the insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), for example, prepreg, ABF, FR-4, BT, or the like. Alternatively, a PID resin may also be used as the insulating material.

The core wiring layers 112a, 112b, and 112c may serve to redistribute the connection pads 120P of the semiconductor chip 120. A material of each of the core wiring layers 112a, 112b, and 112c may be a conductive material such as copper (Cu), aluminum (Al), silver (Ag), tin (Sn), gold (Au), nickel (Ni), lead (Pb), titanium (Ti), or alloys thereof. The core wiring layers 112a, 112b, and 112c may perform various functions depending on designs of their corresponding layers. For example, the core wiring layers 112a, 112b, and 112c may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the core wiring layers 112a, 112b, and 112c may include signal via pads, ground via pads, and the like.

The core vias 113a and 113b may electrically connect the core wiring layers 112a, 112b, and 112c formed on different layers to each other, resulting in an electrical path in the core member 110. A material of each of the core vias 113a and 113b may be a conductive material. Each of the core vias 113a and 113b may be entirely filled with a conductive material, or a conductive material may also be formed along a wall of each of via holes. In addition, each of the core vias 113a and 113b may have any shape known in the related art, such as a tapered shape, a cylindrical shape, and the like. When holes for the first core vias 113a are formed, some of the pads of the first core wiring layer 112a may serve as a stopper, and it may thus be advantageous in a process that each of the first core vias 113a has the tapered shape of which a width of a lower surface is greater than that of an upper surface. In this case, the first core vias 113a may be integrated with pad patterns of the second core wiring layer 112b. In addition, when holes for the second core vias 113b are formed, some of the pads of the second core wiring layer 112b may serve as a stopper, and it may thus be advantageous in a process that each of the second core vias 113b has the tapered shape of which a width of a lower surface is greater than that of an upper surface. In this case, the second core vias 113b may be integrated with pad patterns of the third core wiring layer 112c.

Descriptions of other configurations may overlap those described above with regard to the composite antenna substrate and semiconductor package module 300A according to the exemplary embodiment, and are thus omitted.

Figure 14:
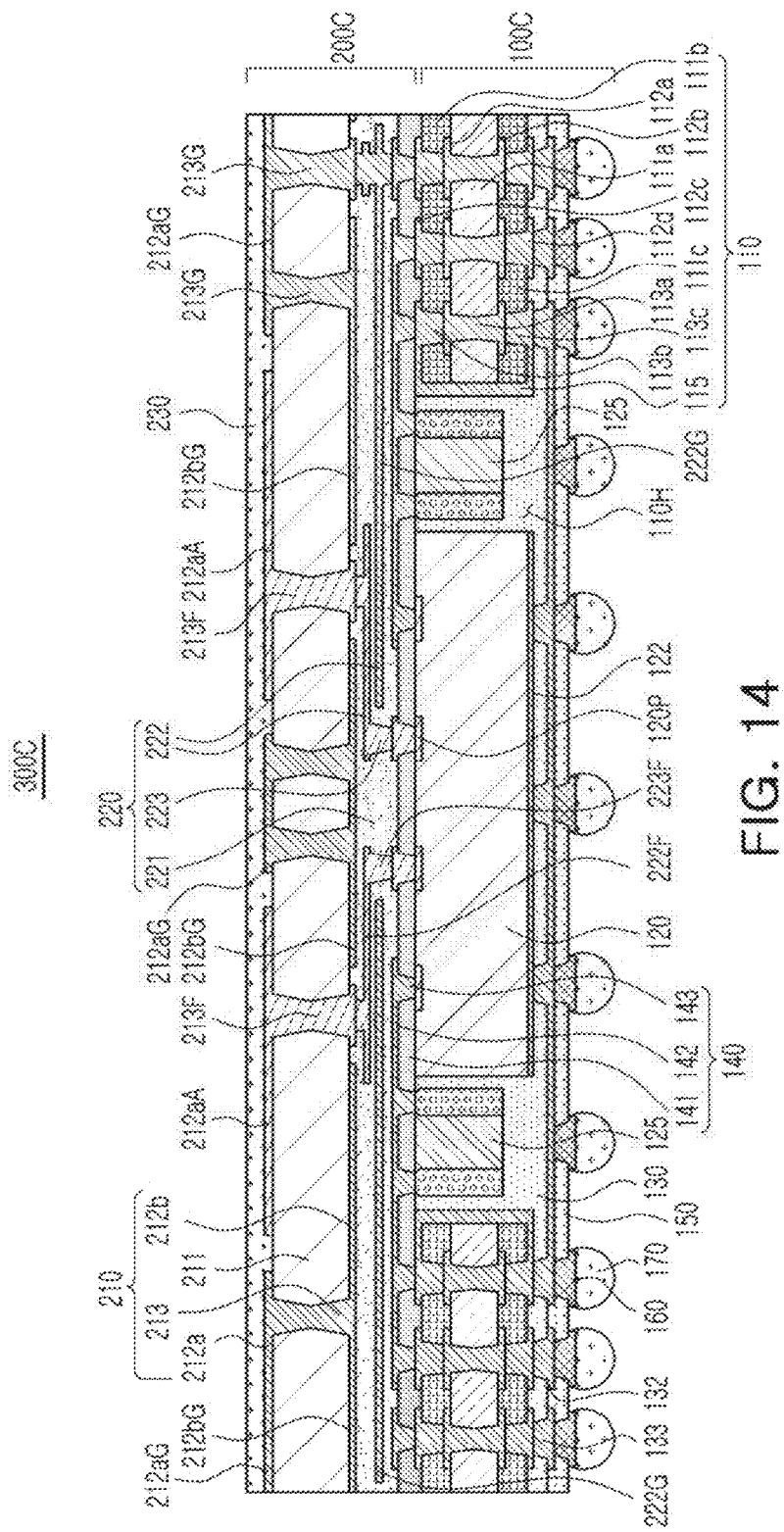
FIG. 14 is a schematic cross-sectional view illustrating another example of a composite antenna substrate and semiconductor package module.

FIG. 14 is a schematic cross-sectional view illustrating another example of a composite antenna substrate and semiconductor package module.

Referring to FIG. 14, a composite antenna substrate and semiconductor package module 300C according to another exemplary embodiment in the present disclosure may have a form in which an antenna substrate 200C and a semiconductor package 100C are integrated with each other. In this case, in the semiconductor package 100C, a core member 110 may include a first dielectric layer 111a, a first core wiring layer 112a and a second core wiring layer 112b disposed on opposite surfaces of the first dielectric layer 111a, respectively, a second dielectric layer 111b disposed on the first dielectric layer 111a and covering the first core wiring layer 112a, a third core wiring layer 112c disposed on the second dielectric layer 111b, a third dielectric layer 111c disposed on the first dielectric layer 111a and covering the second core wiring layer 112b, and a fourth core wiring layer 112d disposed on the third dielectric layer 111c. The first to fourth core wiring layers 112a, 112b, 112c, and 112d may be electrically connected to connection pads 120. Since the core member 110 may include a large number of core wiring layers 112a, 112b, 112c, and 112d, a connection member 140 may be further simplified. Therefore, a decrease in a yield depending on a defect occurring in a process of forming the connection member 140 may be suppressed. Meanwhile, the first to fourth core wiring layers 112a, 112b, 112c, and 112d may be electrically connected to each other through first to third core vias 113a, 113b, and 113c each penetrating through the first to third dielectric layers 111a, 111b, and 111c. Meanwhile, at least one of the first to fourth core wiring layers 112a, 112b, 112c, and 112d may include filter patterns (not illustrated) electrically connected to antenna patterns 212aA. In this case, a material having a high dielectric constant may be used as an insulating material of an antenna member 210 in order to miniaturize an antenna, and a material having a low dielectric constant may be used as an insulating material of the core member 110 in order to significantly reduce loss of a filter. However, the insulating materials of the antenna member 210 and the core member 110 are not limited thereto.

The first dielectric layer 111a may have a thickness greater than those of the second dielectric layer 111b and the third dielectric layer 111c. The first dielectric layer 111a may be basically relatively thick in order to maintain rigidity, and the second dielectric layer 111b and the third dielectric layer 111c may be introduced in order to form a larger number of core wiring layers 112c and 112d. The first dielectric layer 111a may include an insulating material different from those of the second dielectric layer 111b and the third dielectric layer 111c. For example, the first dielectric layer 111a may be, for example, prepreg including a core material, a filler, and an insulating resin, and the second dielectric layer 111b and the third dielectric layer 111c may be an ABF or a PID film including a filler and an insulating resin. However, the materials of the first dielectric layer 111a and the second and third dielectric layers 111b and 111c are not limited thereto. Similarly, the first core vias 113a penetrating through the first dielectric layer 111a may have a diameter greater than those of second core vias 113b and third core vias 113c each penetrating through the second dielectric layer 111b and the third dielectric layer 111c.

A distance between a redistribution layer 142 of the connection member 140 and the third core wiring layer 112c of the core member 110 may be smaller than that between the redistribution layer 142 of the connection member 140 and the connection pad 120P of a semiconductor chip 120. The reason is that the third core wiring layer 112c may be disposed on the second dielectric layer 111b in protruding form, resulting in being in contact with the connection member 140. The first core wiring layer 112a and the second core wiring layer 112b of the core member 110 may be disposed on a level between an active surface and an inactive surface of the semiconductor chip 120. The core member 110 may be formed to have a thickness corresponding to that of the semiconductor chip 120. Therefore, the first core wiring layer 112a and the second core wiring layer 112b formed in the core member 110 may be disposed on the level between the active surface and the inactive surface of the semiconductor chip 120.

Thicknesses of the core wiring layers 112a, 112b, 112c, and 112d of the core member 110 may be greater than those of the redistribution layers 142 of the connection member 140. Since the core member 110 may have a thickness equal to or greater than that of the semiconductor chip 120, the core wiring layers 112a, 112b, 112c, and 112d may also be formed to have large sizes. On the other hand, the redistribution layers 142 of the connection member 140 may be formed to have relatively small sizes for thinness.

Descriptions of other configurations may overlap that described above in the composite antenna substrate and semiconductor package module 300A, according to the exemplary embodiment, and may thus be omitted.

Figure 15:
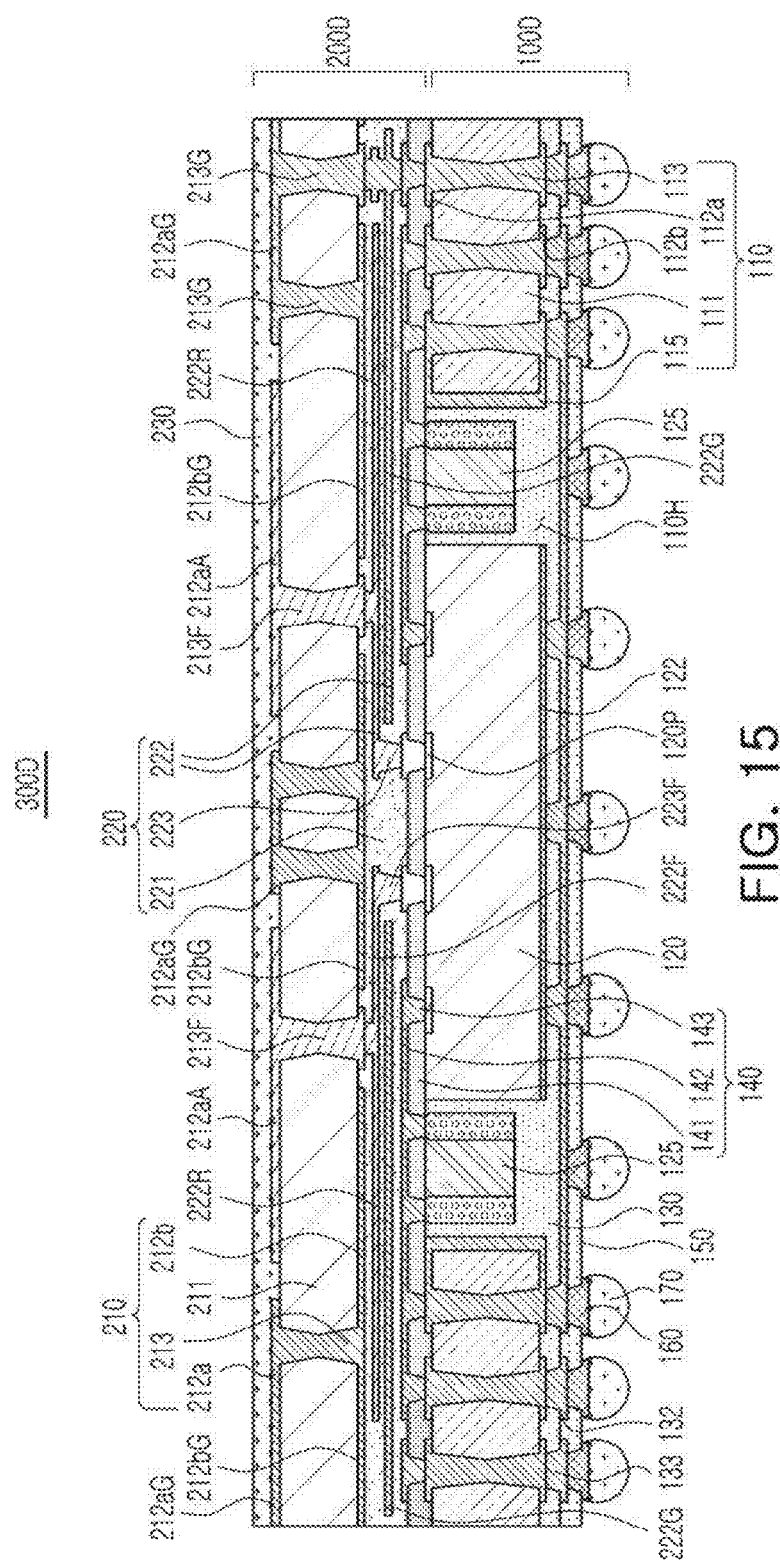
FIG. 15 is a schematic cross-sectional view illustrating another example of a composite antenna substrate and semiconductor package module.

FIG. 15 is a schematic cross-sectional view illustrating another example of a composite antenna substrate and semiconductor package module.

Referring to FIG. 15, a composite antenna substrate and semiconductor package module 300D according to another exemplary embodiment in the present disclosure may have a form in which an antenna substrate 200D and a semiconductor package 100D are integrated with each other. In this case, in the antenna substrate 200D, a wiring layer 222 of a wiring member 220 may include filter patterns 222R. The filter patterns 222R may be electrically connected to feed lines 213F, feeding patterns 222F, and the like. The filter patterns 222R may be microstrip lines, strip lines, or the like, but are not limited thereto. The filter patterns 222R may be appropriately formed on various layers of the wiring member 220. A material having high dielectric constant (Er1) characteristics may be used as an insulating material of an antenna member 210 in order to reduce a size of an antenna, and a material having low dielectric constant (Er12) characteristics may be used as an insulating material of the wiring member 220 in order to significantly reduce loss of a filter. Ground patterns 212bG of the antenna member 210 and/or ground patterns 222G of the wiring member 220 may provide a ground face for the filter patterns 222R.

Descriptions of other configurations may overlap that described above in the composite antenna substrate and semiconductor package module 300A, according to the exemplary embodiment, and may thus be omitted. Meanwhile, a form of the core member 110 described in the composite antenna substrate and semiconductor package module 300B or 300C according to another exemplary embodiment may also be applied to the composite antenna substrate and semiconductor package module 300D according to another exemplary embodiment.

Figure 16:
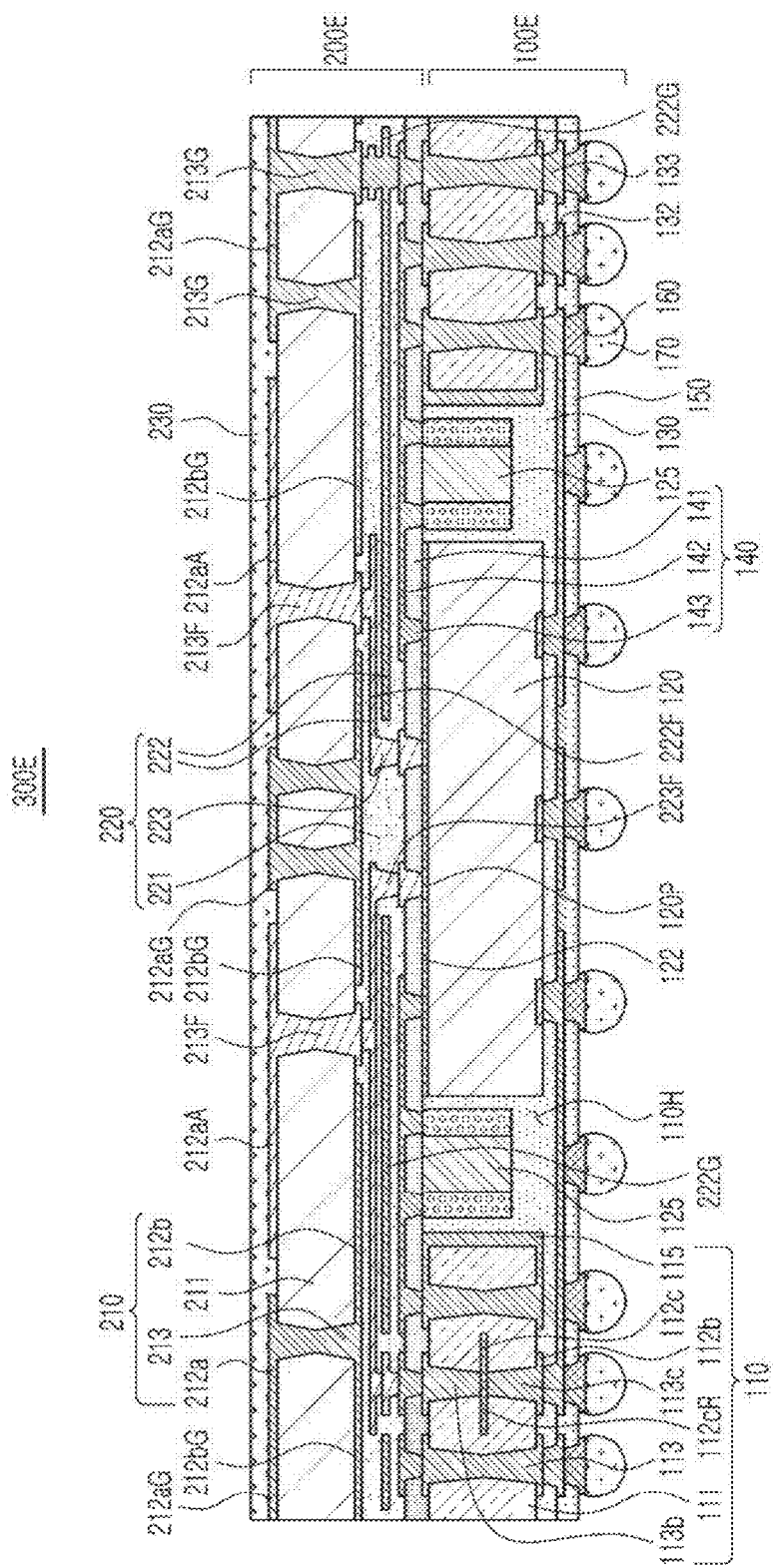
FIG. 16 is a schematic cross-sectional view illustrating another example of a composite antenna substrate and semiconductor package module.

FIG. 16 is a schematic cross-sectional view illustrating another example of a composite antenna substrate and semiconductor package module.

Referring to FIG. 16, a composite antenna substrate and semiconductor package module 300E according to another exemplary embodiment in the present disclosure may have a form in which an antenna substrate 200E and a semiconductor package 100E are integrated with each other. In this case, in the semiconductor package 100E, a core member 110 may further include a third wiring layer 112c embedded in a dielectric layer 111 and second and third core vias 113b and 113c electrically connecting the third wiring layer 112c to first and second wiring layers 112a and 112b. The third wiring layer 112c may include filter patterns 112cR. The filter patterns 112cR may be electrically connected to feed lines 213F, feeding patterns 222F, and the like. The filter patterns 112cR may be microstrip lines, strip lines, or the like, but are not limited thereto. Ground patterns of the first and second wiring layers 112a and 112b of the core member 110 may provide a ground face for the filter patterns 112cR.

A semiconductor chip 120 may be disposed in face-down form. When the semiconductor chip 120 is disposed in face-down form, an active surface of the semiconductor chip 120 may become close to a mainboard to have a high heat dissipation effect to the mainboard. A metal layer 122 formed on an inactive surface of the semiconductor chip 120 may be replaced by a die attachment film in some cases.

Descriptions of other configurations may overlap that described above in the composite antenna substrate and semiconductor package module 300A, according to the exemplary embodiment, and may thus be omitted. Meanwhile, a form of the core member 110 described in the composite antenna substrate and semiconductor package module 300B or 300C according to another exemplary embodiment may also be applied to the composite antenna substrate and semiconductor package module 300E according to another exemplary embodiment. In this case, the wiring layer of the core member disposed in the semiconductor package may include the filter patterns.

Figure 17:
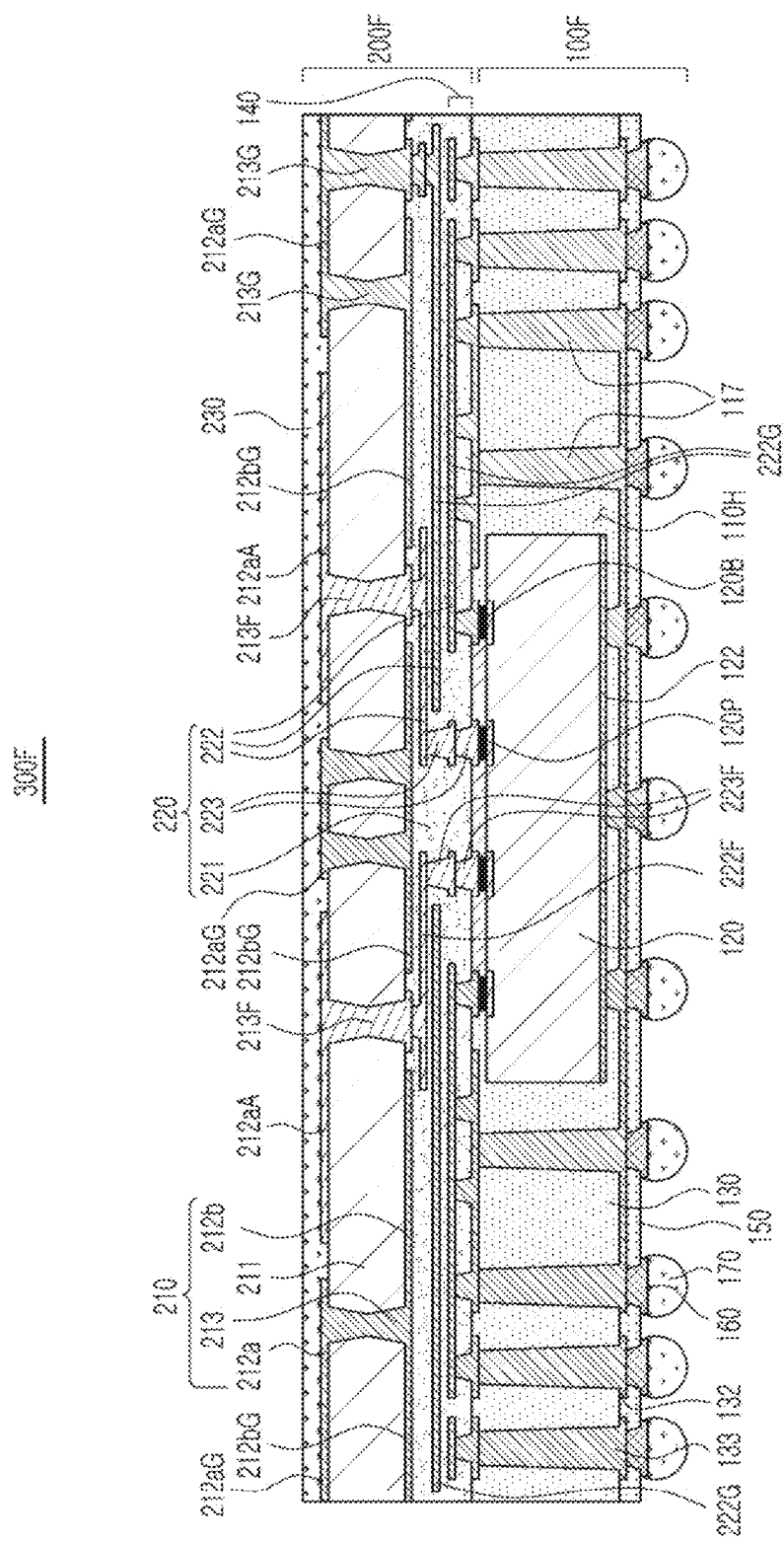
FIG. 17 is a schematic cross-sectional view illustrating another example of a composite antenna substrate and semiconductor package module.

FIG. 17 is a schematic cross-sectional view illustrating another example of a composite antenna substrate and semiconductor package module.

Referring to FIG. 17, a composite antenna substrate and semiconductor package module 300F according to another exemplary embodiment in the present disclosure may have a form in which an antenna substrate 200F and a semiconductor package 100F are integrated with each other. Meanwhile, in the composite antenna substrate and semiconductor package module 300F according to another exemplary embodiment, the antenna substrate 200F may be first formed, and the semiconductor package 100F may be formed by mounting a semiconductor chip 120 on a wiring member 220 of the antenna substrate 200F using bumps 120B such as solders, or the like, encapsulating the semiconductor chip 120 by an encapsulant 130, and further forming a backside wiring layer 132, backside vias 133, and the like. That is, the composite antenna substrate and semiconductor package module 300F in which the antenna substrate 200F and the semiconductor package 100F are integrated with each other may be manufactured by a chip-last method. Therefore, a connection member 140 of the semiconductor package 100F may be unified in the wiring member 220 of the antenna substrate 200F. That is, as illustrated in FIG. 17, a portion of the wiring member 220 may serve as the connection member 140. That is, the wiring member 220 may include the connection member 140. Meanwhile, in this case, the semiconductor package 100F may not include a core member 110, and an electrical connection path between upper and lower portions of the semiconductor package 100F may be provided through through-vias 117 penetrating through the encapsulant 130.

Descriptions of other configurations may overlap that described above in the composite antenna substrate and semiconductor package module 300A, according to the exemplary embodiment, and may thus be omitted.

Figure 18:
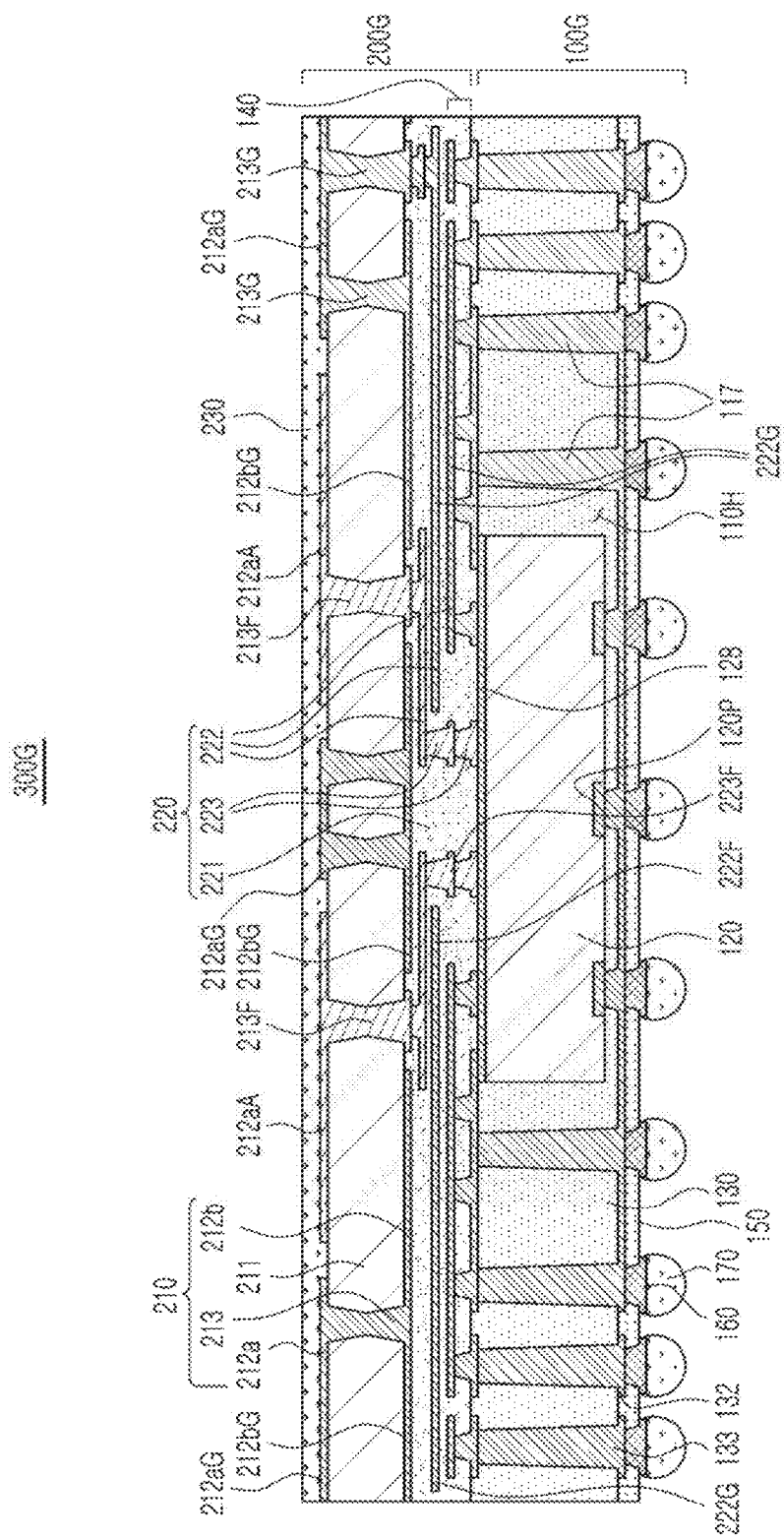
FIG. 18 is a schematic cross-sectional view illustrating another example of a composite antenna substrate and semiconductor package module.

FIG. 18 is a schematic cross-sectional view illustrating another example of a composite antenna substrate and semiconductor package module.

Referring to FIG. 18, a composite antenna substrate and semiconductor package module 300G according to another exemplary embodiment in the present disclosure may have a form in which an antenna substrate 200G and a semiconductor package 100G are integrated with each other. Meanwhile, in the composite antenna substrate and semiconductor package module 300G according to another exemplary embodiment, a semiconductor chip 120 of the semiconductor package 100G may be disposed in face-down form. In this case, an inactive surface of the semiconductor chip 120 may be attached to a wiring member 220 of the antenna substrate 200G through a die attachment film 128. When the semiconductor chip 120 is disposed in face-down form, an active surface of the semiconductor chip 120 may become close to a mainboard to have a high heat dissipation effect to the mainboard. Also in this case, a connection member 140 of the semiconductor package 100G may be unified in the wiring member 220 of the antenna substrate 200G. That is, as illustrated in FIG. 18, a portion of the wiring member 220 may serve as the connection member 140. That is, the wiring member 220 may include the connection member 140. Meanwhile, in this case, the semiconductor package 100G may not include a core member 110, and an electrical connection path between upper and lower portions of the semiconductor package 100G may be provided through through-vias 117 through an encapsulant 130.

Descriptions of other configurations may overlap that described above in the composite antenna substrate and semiconductor package module 300A, according to the exemplary embodiment, and may thus be omitted.

Figure 19:
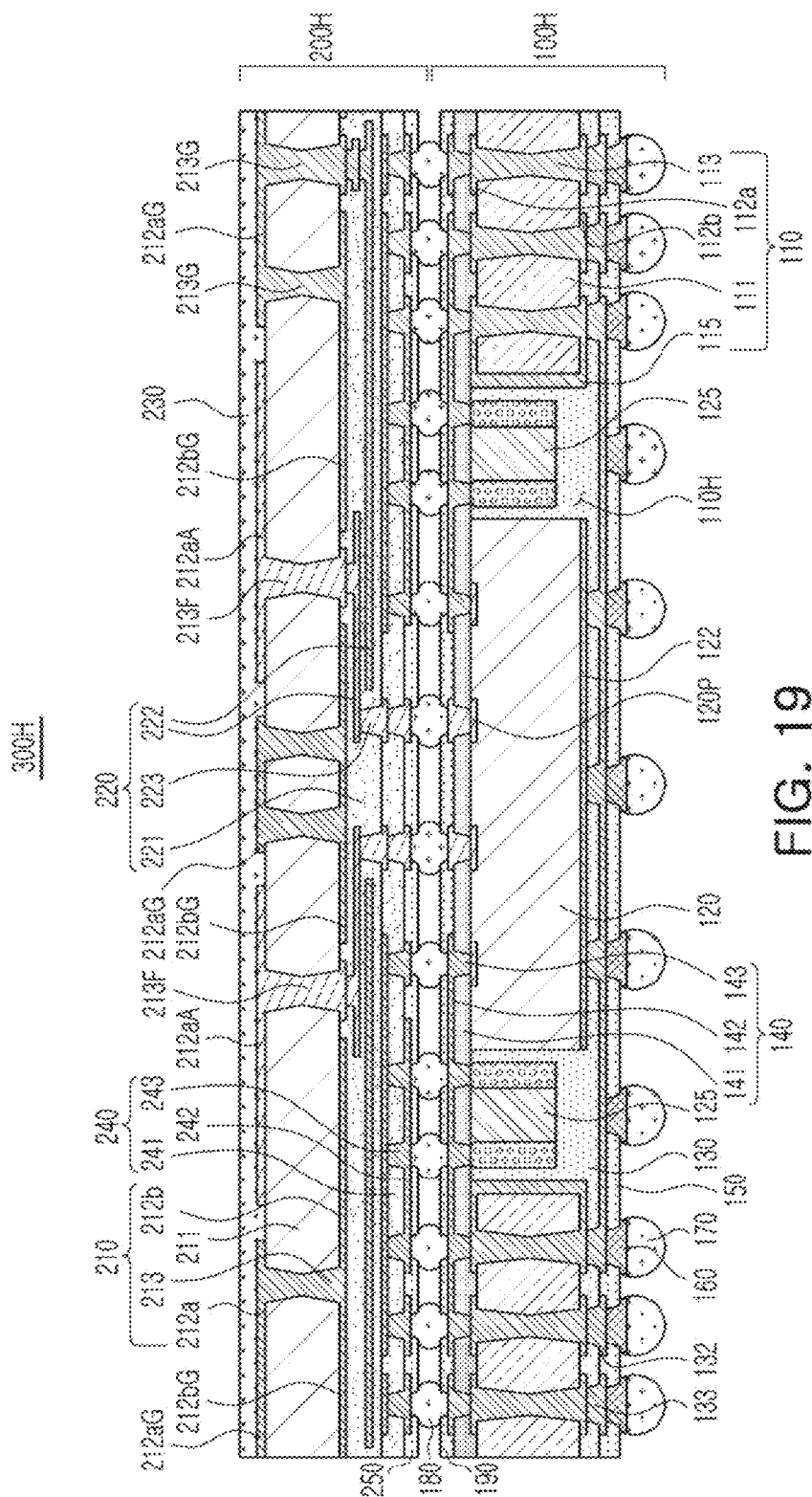
FIG. 19 is a schematic cross-sectional view illustrating another example of a composite antenna substrate and semiconductor package module.

FIG. 19 is a schematic cross-sectional view illustrating another example of a composite antenna substrate and semiconductor package module.

Referring to FIG. 19, in a composite antenna substrate and semiconductor package module 300H according to another exemplary embodiment in the present disclosure, an antenna substrate 200H and a semiconductor package 100H may be coupled to each other in a package-on-package (PoP) form. In this case, the antenna substrate 200H may further include a second wiring member 240 disposed below a first wiring member 220 and including an insulating layer 241, a wiring layer 242, and vias 243. Passivation layers 190 and 250 may be disposed on a connection member 140 and the second wiring member 240, respectively. The connection member 140 of the semiconductor package 100H and the second wiring member 240 of the antenna substrate 200H may be electrically connected to each other through electrical connection structures 180 such as solder balls, or the like.

Descriptions of other configurations may overlap that described above in the composite antenna substrate and semiconductor package module 300A, according to the exemplary embodiment, and may thus be omitted.

Figure 20:
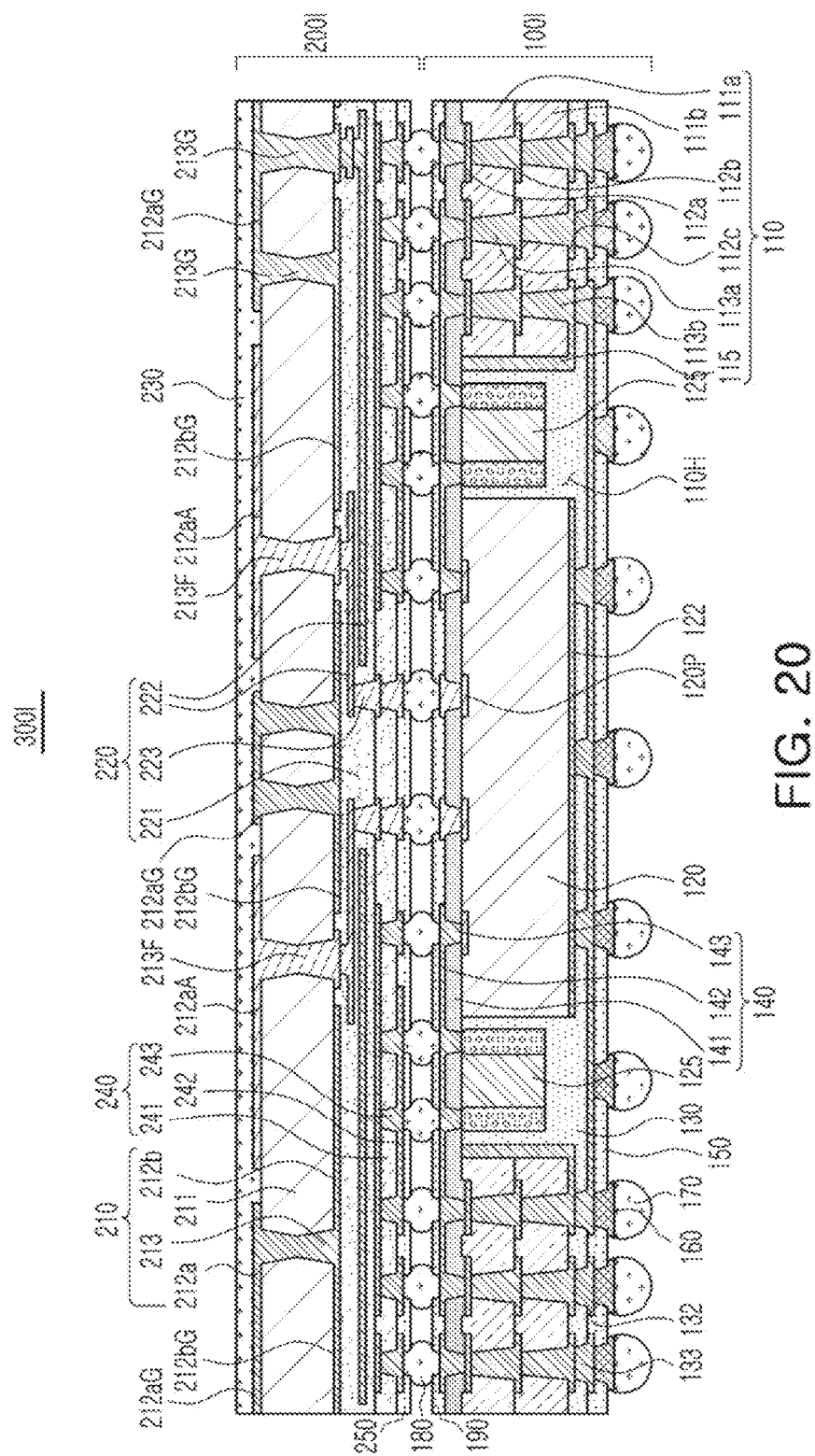
FIG. 20 is a schematic cross-sectional view illustrating another example of a composite antenna substrate and semiconductor package module.

FIG. 20 is a schematic cross-sectional view illustrating another example of a composite antenna substrate and semiconductor package module.

Referring to FIG. 20, in a semiconductor package 100I of a composite antenna substrate and semiconductor package module 300I according to another exemplary embodiment in the present disclosure, a core member 110 may include a first dielectric layer 111a in contact with a connection member 140, a first core wiring layer 112a in contact with the connection member 140 and embedded in the first dielectric layer 111a, a second core wiring layer 112b disposed on the other surface of the first dielectric layer 111a opposing one surface of the first dielectric layer 111a in which the first core wiring layer 112a is embedded, a second dielectric layer 111b disposed on the first dielectric layer 111a and covering the second core wiring layer 112b, and a third core wiring layer 112c disposed on the second dielectric layer 111b, as in the composite antenna substrate and semiconductor package module 300B according to another exemplary embodiment described above. The first to third core wiring layers 112a, 112b, and 112c may be electrically connected to connection pads 120. The first and second core wiring layers 112a and 112b and the second and third core wiring layers 112b and 112c may be electrically connected to each other through first and second core vias 113*a* and 113*b* penetrating through the first and second dielectric layers 111*a* and 111*b*, respectively. Meanwhile, at least one of the first to third core wiring layers 112*a*, 112*b*, and 112*c* may include filter patterns (not illustrated) electrically connected to antenna patterns 212*a*A. In this case, a material having a high dielectric constant may be used as an insulating material of an antenna member 210 in order to miniaturize an antenna, and a material having a low dielectric constant may be used as an insulating material of the core member 110 in order to significantly reduce loss of a filter. However, the insulating materials of the antenna member 210 and the core member 110 are not limited thereto.

A description of other configurations overlaps that described above in the composite antenna substrate and semiconductor package module 300A according to the exemplary embodiment and the composite antenna substrate and semiconductor package module 300B or 300H according to another exemplary embodiment, and is thus omitted.

Figure 21:
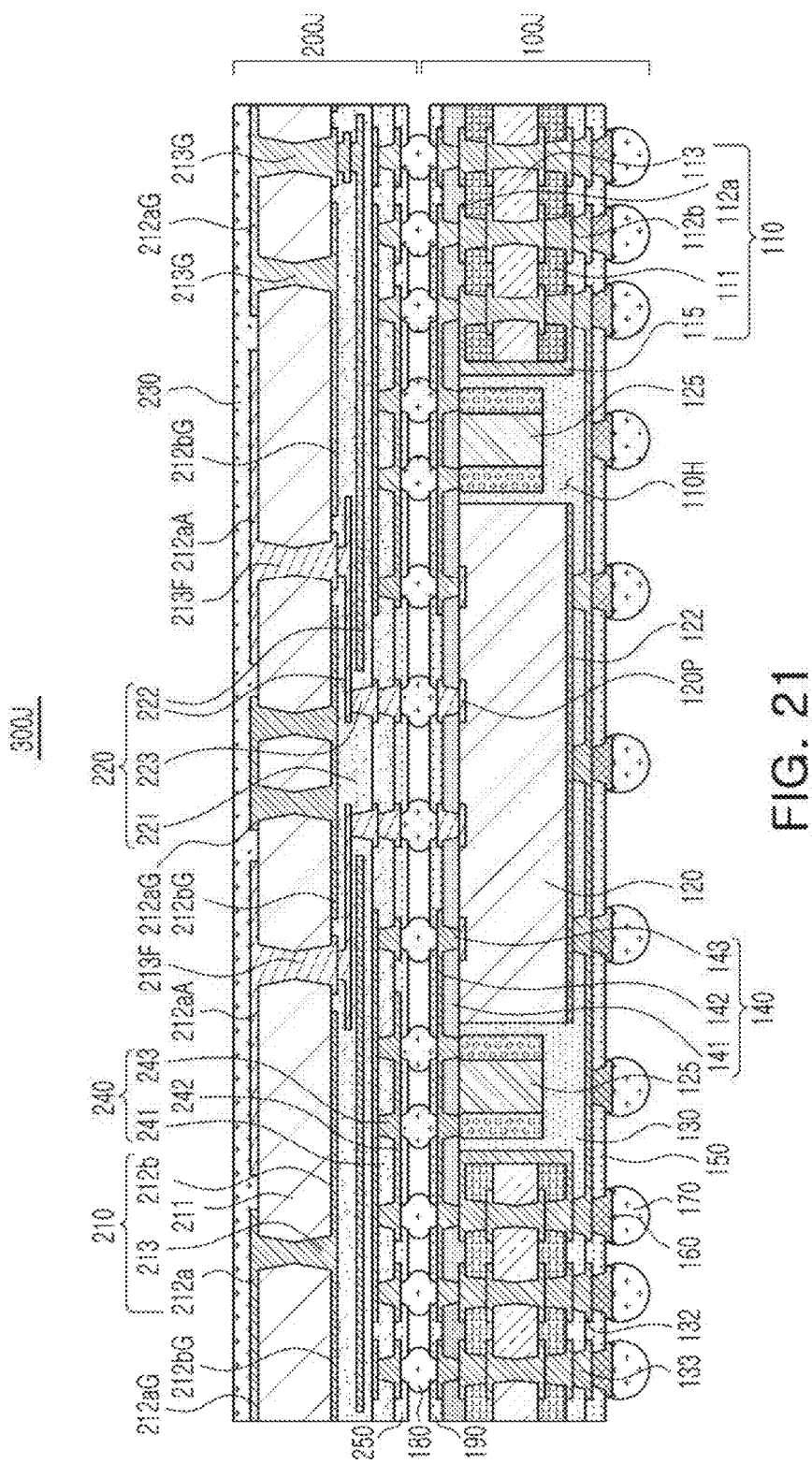
FIG. 21 is a schematic cross-sectional view illustrating another example of a composite antenna substrate and semiconductor package module.

FIG. 21 is a schematic cross-sectional view illustrating another example of a composite antenna substrate and semiconductor package module.

Referring to FIG. 21, in a semiconductor package 100J of a composite antenna substrate and semiconductor package module J according to another exemplary embodiment, a core member 110 may include a first dielectric layer 111*a*, a first core wiring layer 112*a* and a second core wiring layer 112*b* disposed on opposite surfaces of the first dielectric layer 111*a*, respectively, a second dielectric layer 111*b* disposed on the first dielectric layer 111*a* and covering the first core wiring layer 112*a*, a third core wiring layer 112*c* disposed on the second dielectric layer 111*b*, a third dielectric layer 111*c* disposed on the first dielectric layer 111*a* and covering the second core wiring layer 112*b*, and a fourth core wiring layer 112*d* disposed on the third dielectric layer 111*c*, as in the composite antenna substrate and semiconductor package module 300C according to another exemplary embodiment described above. The first to fourth core wiring layers 112*a*, 112*b*, 112*c*, and 112*d* may be electrically connected to connection pads 120. Since the core member 110 may include a large number of core wiring layers 112*a*, 112*b*, 112*c*, and 112*d*, a connection member 140 may be further simplified. Therefore, a decrease in a yield depending on a defect occurring in a process of forming the connection member 140 may be suppressed. Meanwhile, the first to fourth core wiring layers 112*a*, 112*b*, 112*c*, and 112*d* may be electrically connected to each other through first to third core vias 113*a*, 113*b*, and 113*c* each penetrating through the first to third dielectric layers 111*a*, 111*b*, and 111*c*. Meanwhile, at least one of the first to fourth core wiring layers 112*a*, 112*b*, 112*c*, and 112*d* may include filter patterns (not illustrated) electrically connected to antenna patterns 212*a*A. In this case, a material having a high dielectric constant may be used as an insulating material of an antenna member 210 in order to miniaturize an antenna, and a material having a low dielectric constant may be used as an insulating material of the core member 110 in order to significantly reduce loss of a filter. However, the insulating materials of the antenna member 210 and the core member 110 are not limited thereto.

A description of other configurations overlaps that described above in the composite antenna substrate and semiconductor package module 300A according to the exemplary embodiment and the composite antenna substrate and semiconductor package module 300C or 300H according to another exemplary embodiment, and is thus omitted.

Figure 22:
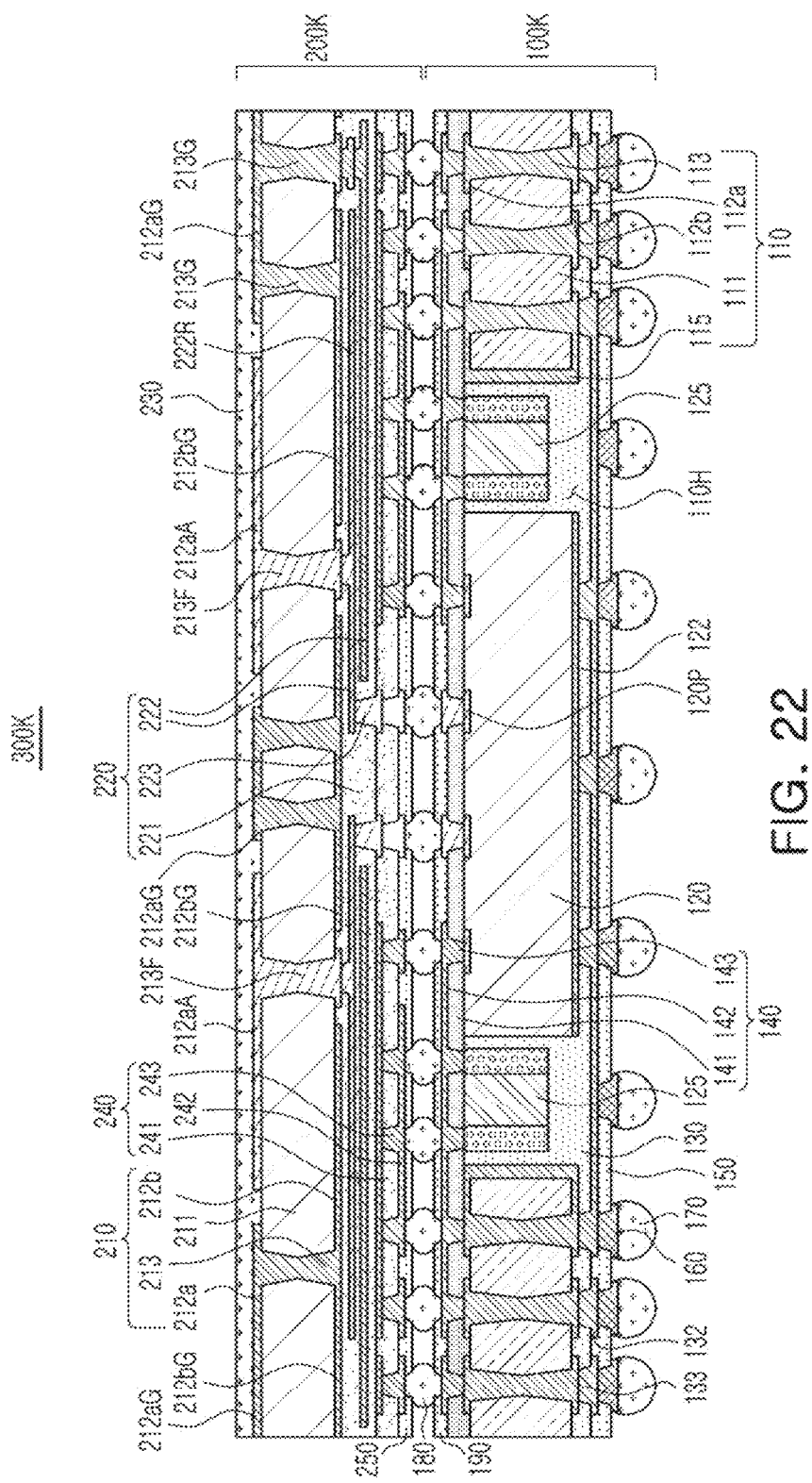
FIG. 22 is a schematic cross-sectional view illustrating another example of a composite antenna substrate and semiconductor package module.

FIG. 22 is a schematic cross-sectional view illustrating another example of a composite antenna substrate and semiconductor package module.

Referring to FIG. 22, in an antenna substrate 200K of a composite antenna substrate and semiconductor package module 300K according to another exemplary embodiment in the present disclosure, a wiring layer 22 of a wiring member 220 may include filter patterns 222R, as in the composite antenna substrate and semiconductor package module 300D according to another exemplary embodiment described above. The filter patterns 222R may be electrically connected to feed lines 213F, feeding patterns 222F, and the like. The filter patterns 222R may be microstrip lines, strip lines, or the like, but are not limited thereto. Ground patterns 212*b*G of the antenna member 210 and/or ground patterns 222G of the wiring member 220 may provide a ground face for the filter patterns 222R.

A description of other configurations overlaps that described above in the composite antenna substrate and semiconductor package module 300A according to the exemplary embodiment and the composite antenna substrate and semiconductor package module 300D or 300H according to another exemplary embodiment, and is thus omitted. Meanwhile, a form of the core member 110 described in the composite antenna substrate and semiconductor package module 300I or 300J according to another exemplary embodiment may also be applied to the composite antenna substrate and semiconductor package module 300K according to another exemplary embodiment.

Figure 23:
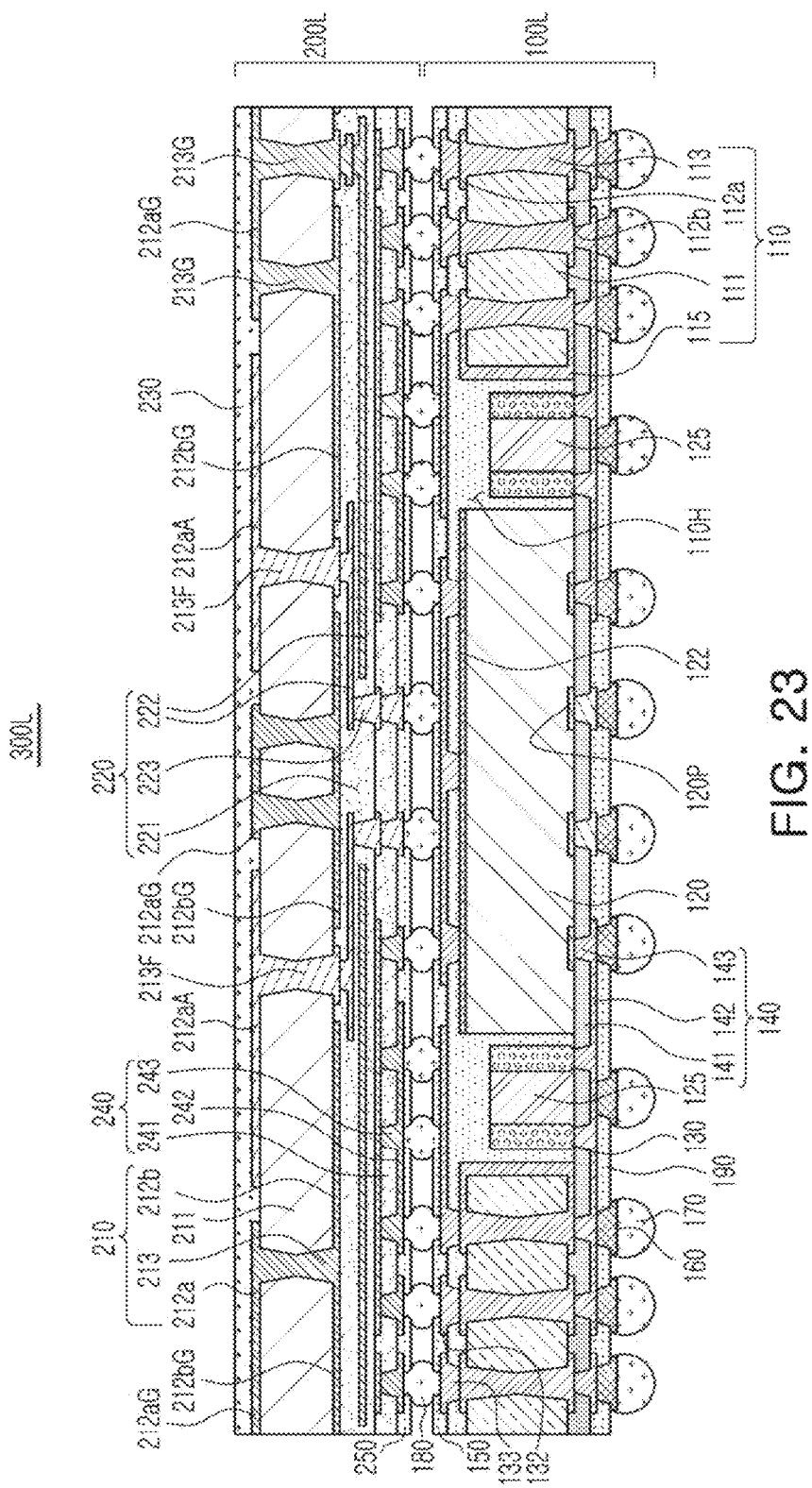
FIG. 23 is a schematic cross-sectional view illustrating another example of a composite antenna substrate and semiconductor package module.

FIG. 23 is a schematic cross-sectional view illustrating another example of a composite antenna substrate and semiconductor package module.

Referring to FIG. 23, in a composite antenna substrate and semiconductor package module 300L according to another exemplary embodiment in the present disclosure, a semiconductor chip 120 may be disposed in face-down form. When the semiconductor chip 120 is disposed in face-down form, an active surface of the semiconductor chip 120 may become close to a mainboard to have a high heat dissipation effect to the mainboard. A connection member 140 may be disposed on the active surface of the semiconductor chip 120, and a backside redistribution layer 132 and backside vias 133 may be disposed on an inactive surface of the semiconductor chip 120. A metal layer 122 formed on the inactive surface of the semiconductor chip 120 may be replaced by a die attachment film in some cases.

Descriptions of other configurations may overlap that described above in the composite antenna substrate and semiconductor package module 300A according to the exemplary embodiment and the composite antenna substrate and semiconductor package module 300H according to another exemplary embodiment, and are thus omitted. Meanwhile, a form of the core member 110 described in the composite antenna substrate and semiconductor package module 300I or 300J according to another exemplary embodiment may also be applied to the composite antenna substrate and semiconductor package module 300L according to another exemplary embodiment.

As set forth above, according to the exemplary embodiments in the present disclosure, a composite antenna substrate and semiconductor package module in which a signal path between an antenna and a semiconductor chip may be designed to have a shortest distance, omnidirectional coverage characteristics may be secured, and reception sensitivity of the antenna may be improved may be provided.

While exemplary embodiments have been shown and described above, it will be apparent to those skilled in the art that modifications and variations could be made without departing from the scope of the present invention as defined by the appended claims.

What is claimed is:

1. A composite antenna substrate and semiconductor package module comprising:
   a fan-out semiconductor package including:
   a semiconductor chip having an active surface having connection pads disposed thereon and an inactive surface opposing the active surface,
   an encapsulant encapsulating at least portions of the semiconductor chip, and
   a connection member disposed on the semiconductor chip and including a redistribution layer electrically connected to the connection pads; and
   an antenna substrate including:
   an antenna member and a wiring member disposed below the antenna member,
   the antenna member including an insulating layer, a first pattern layer disposed on a first surface of the insulating layer and including antenna patterns, a second pattern layer disposed on a second surface opposite the first surface of the insulating layer and including ground patterns, and vias penetrating through the insulating layer and including feed lines electrically connected to the antenna patterns, and
   the wiring member including wiring layers including feeding patterns electrically connected to the feed lines,
   wherein the fan-out semiconductor package and the antenna substrate are coupled to each other so that the connection member and the wiring member face each other.

2. The composite antenna substrate and semiconductor package module of claim 1, wherein the semiconductor chip includes a radio frequency integrated circuit (RFIC).

3. The composite antenna substrate and semiconductor package module of claim 1, wherein the antenna pattern includes at least one of a dipole antenna and a patch antenna.

4. The composite antenna substrate and semiconductor package module of claim 3, wherein the patch antenna and the feed line connected to the patch antenna are surrounded by ground vias penetrating through the insulating layer of the antenna member.

5. The composite antenna substrate and semiconductor package module of claim 1, wherein the semiconductor chip is disposed in face-up form so that the active surface is directed toward the wiring member.

6. The composite antenna substrate and semiconductor package module of claim 1, wherein the wiring layer of the wiring member includes filter patterns electrically connected to the feed lines.

7. The composite antenna substrate and semiconductor package module of claim 1, wherein the antenna substrate is integrated with the fan-out semiconductor package.

8. The composite antenna substrate and semiconductor package module of claim 7, wherein the connection member and the wiring member are in contact and are integrated with each other.

9. The composite antenna substrate and semiconductor package module of claim 8, wherein the redistribution layer of the connection member and the wiring layer of the wiring member are electrically connected to each other through vias of the wiring member.

10. The composite antenna substrate and semiconductor package module of claim 7, wherein the connection member is unified in the wiring member.

11. The composite antenna substrate and semiconductor package module of claim 10, wherein the fan-out semiconductor package further includes through-vias penetrating through the encapsulant and electrically connected to the wiring layer of the wiring member.

12. The composite antenna substrate and semiconductor package module of claim 10, wherein the semiconductor chip is disposed on the wiring member through a bump.

13. The composite antenna substrate and semiconductor package module of claim 10, wherein the semiconductor chip is disposed in face-down form so that the inactive surface is directed toward the wiring member, and
   the inactive surface of the semiconductor chip is attached to the wiring member through a die attachment film.

14. The composite antenna substrate and semiconductor package module of claim 1, wherein the antenna substrate is disposed on the fan-out semiconductor package, and
   the antenna substrate and the fan-out semiconductor package are connected to each other through electrical connection structures.

15. The composite antenna substrate and semiconductor package module of claim 1, wherein the fan-out semiconductor package further includes a core member having a through-hole,
   the semiconductor chip is disposed in the core member, and
   the core member includes at least one core wiring layer electrically connected to the connection pads.

16. The composite antenna substrate and semiconductor package module of claim 15, wherein the fan-out semiconductor package further includes a passive component disposed adjacent to the semiconductor chip in the through-hole and electrically connected to the connection pads through the redistribution layer of the connection member.

17. The composite antenna substrate and semiconductor package module of claim 15, wherein the core wiring layer of the core member includes filter patterns electrically connected to the feed lines.

18. The composite antenna substrate and semiconductor package module of claim 15, wherein the core member includes
   a first dielectric layer in contact with the connection member,
   a first core wiring layer in contact with the connection member and embedded in the first dielectric layer,
   a second core wiring layer disposed on a first surface of the first dielectric layer opposing a second surface of the first dielectric layer on which the first core wiring layer is disposed, and
   first core vias penetrating through the first dielectric layer and electrically connecting the first and second core wiring layers to each other, and
   the first and second core wiring layers are electrically connected to the connection pads.

19. The composite antenna substrate and semiconductor package module of claim 18, wherein the core member further includes
   a second dielectric layer disposed on the first dielectric layer and covering the second core wiring layer,
   a third core wiring layer disposed on a first surface of the second dielectric layer opposing a second surface of the second dielectric layer on which the second core wiring layer is disposed, and
   second core vias penetrating through the second dielectric layer and electrically connecting the second and third core wiring layers to each other, and the third core wiring layer is electrically connected to the connection pads.

20. The composite antenna substrate and semiconductor package module of claim 15, wherein the core member includes
a first dielectric layer,
first and second core wiring layers disposed on opposite surfaces of the first dielectric layer, respectively, and
first core vias penetrating through the first dielectric layer and electrically connecting the first and second core wiring layers to each other, and
the first and second core wiring layers are electrically connected to the connection pads.

21. The composite antenna substrate and semiconductor package module of claim 20, wherein the core member further includes
a second dielectric layer disposed on the first dielectric layer and covering the first core wiring layer,
a third dielectric layer disposed on the first dielectric layer and covering the second core wiring layer,
a third core wiring layer disposed on the second dielectric layer,
a fourth core wiring layer disposed on the third dielectric layer,
second core vias penetrating through the second dielectric layer and electrically connecting the first and third core wiring layers to each other, and
third core vias penetrating through the third dielectric layer and electrically connecting the second and fourth core wiring layers to each other, and
the third and fourth core wiring layers are electrically connected to the connection pads.

22. A composite antenna substrate and semiconductor package module comprising:
a fan-out semiconductor package including:
a core member having a through-hole,
a semiconductor chip disposed in the through-hole and having an active surface having connection pads disposed thereon and an inactive surface opposing the active surface,
an encapsulant encapsulating at least portions of the semiconductor chip, and
a connection member disposed on the semiconductor chip, the core member including a core wiring layer and the connection member including a redistribution layer electrically connected to the connection pads; and
an antenna substrate including:
an antenna member in which a first pattern layer including antenna patterns is disposed on an insulating layer, a second pattern layer including ground patterns is disposed below the insulating layer, and vias penetrating through the insulating layer and including feed lines electrically connected to the antenna patterns are formed in the insulating layer, and
a wiring member disposed below the antenna member and including wiring layers including feeding patterns electrically connected to the feed lines,
wherein the antenna substrate is disposed on the fan-out semiconductor package, and
the antenna substrate and the fan-out semiconductor package are connected to each other through electrical connection structures.

23. The composite antenna substrate and semiconductor package module of claim 22, wherein the fan-out semiconductor package further includes:
a first metal layer disposed on a wall surface of the through-hole and extending to at least a surface of the core member, a second metal layer disposed on the encapsulant to cover the inactive surface of the semiconductor chip; and
a metal via connecting the first metal layer and the second metal layer to each other, while penetrating through the encapsulant.

24. The composite antenna substrate and semiconductor package module of claim 23, wherein the fan-out semiconductor package further includes:
a passivation layer disposed on the encapsulant and having an opening exposing at least a portion of the second metal layer; and
a second electrical connection structure disposed on the opening of the passivation layer, while being connected to the second metal layer having the at least a portion exposed by the opening.

25. The composite antenna substrate and semiconductor package module of claim 23, wherein the first metal layer and the second metal layer comprise a ground pattern.

* * * * *